(12) United States Patent
Luciani

(10) Patent No.: US 12,216,964 B2
(45) Date of Patent: Feb. 4, 2025

(54) SYSTEMS AND METHODS FOR MODELING BUILDINGS AND RISK ASSESSMENT

(71) Applicant: METROPOLITAN LIFE INSURANCE CO., New York, NY (US)

(72) Inventor: Terrance Luciani, Monroe Township, NJ (US)

(73) Assignee: METROPOLITAN LIFE ISURANCE CO., New York, NY (US)

( * ) Notice: Subject to any disclaimer, the term of this patent is extended or adjusted under 35 U.S.C. 154(b) by 981 days.

(21) Appl. No.: 17/165,782

(22) Filed: Feb. 2, 2021

(65) Prior Publication Data

US 2022/0245290 A1     Aug. 4, 2022

(51) Int. Cl.
| | |
|---|---|
| G06F 30/13 | (2020.01) |
| G06F 16/23 | (2019.01) |
| G06Q 10/0635 | (2023.01) |
| G06Q 30/0201 | (2023.01) |
| H04L 12/28 | (2006.01) |

(52) U.S. Cl.
CPC .......... *G06F 30/13* (2020.01); *G06F 16/2358* (2019.01); *G06F 16/2365* (2019.01); *G06Q 10/0635* (2013.01); *G06Q 30/0206* (2013.01); *H04L 12/2823* (2013.01)

(58) Field of Classification Search
CPC .. G06F 30/13; G06F 16/2358; G06F 16/2365; G06Q 10/0635; G06Q 30/0206; H04L 12/2823
See application file for complete search history.

(56) References Cited

U.S. PATENT DOCUMENTS

| | | | |
|---|---|---|---|
| 10,579,749 B1 * | 3/2020 | Davis | G06F 30/20 |
| 11,069,145 B1 * | 7/2021 | Pearson | G06T 19/006 |
| 2021/0400043 A1 * | 12/2021 | Su | H04L 63/0807 |

FOREIGN PATENT DOCUMENTS

WO    WO-2015161118 A1 *   10/2015    ............. G06Q 40/08

* cited by examiner

*Primary Examiner* — Kibrom K Gebresilassie
(74) *Attorney, Agent, or Firm* — Polsinelli

(57) ABSTRACT

In one embodiment, a smart home modeling system receives objective data from a public data source. The system modifies baseline age information from the objective data based on indications from service and upgrade records, as well as smart home sensor measurements, to generate a corrected age model for the home. The system determines the effective ages of systems in the home in the corrected age model, and then uses the corrected age model to generate a risk model for the home. Based on the generated risk model, maintenance needs and statuses are re-evaluated. The system provides a virtual dashboard to view results from the smart home model. The dashboard displays alerts about particular systems of the home with elevated risk levels. Additionally, the dashboard generates price information based on the corrected age model and the risk model. The dashboard also notifies a user about service interventions for home systems.

17 Claims, 9 Drawing Sheets

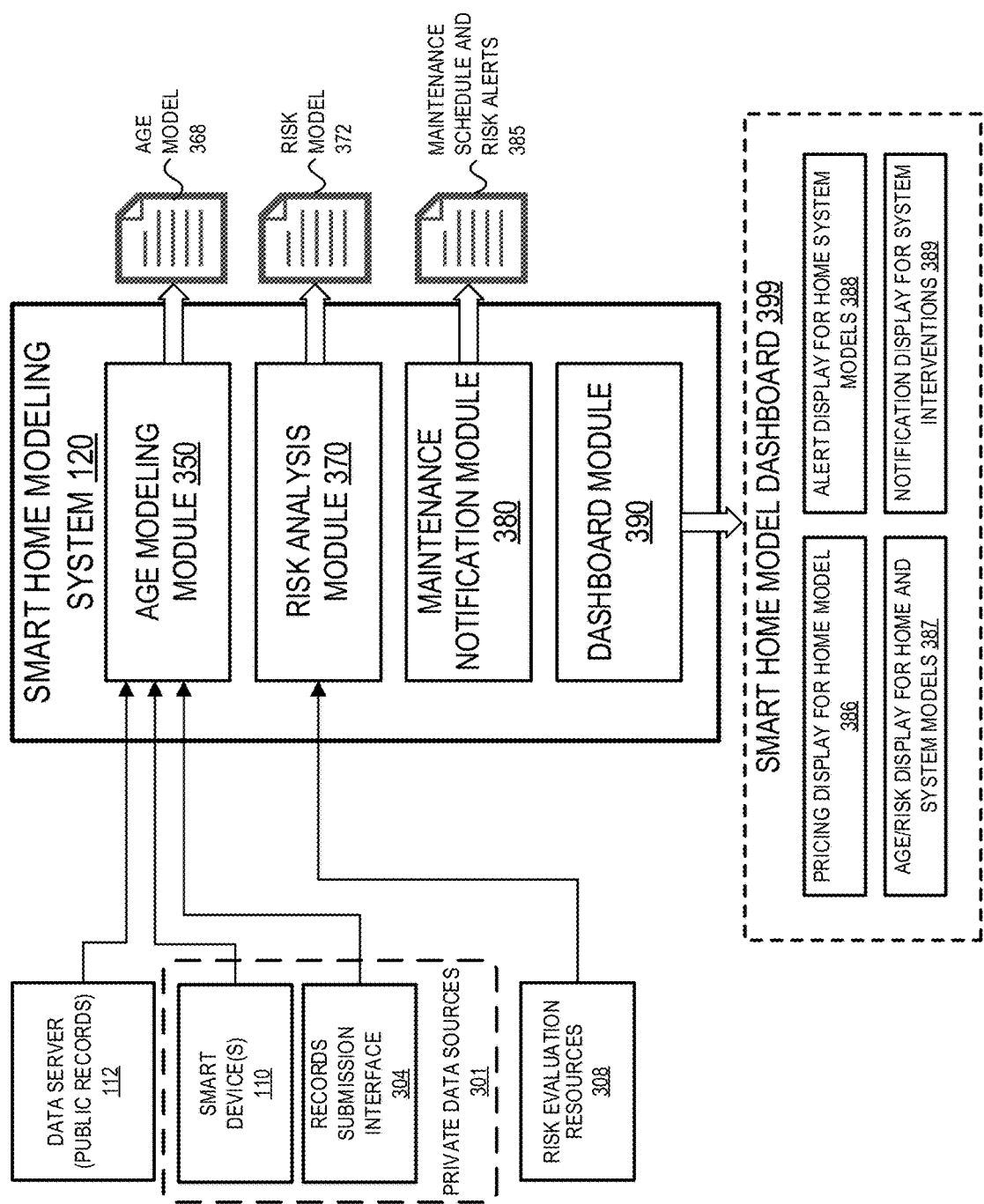

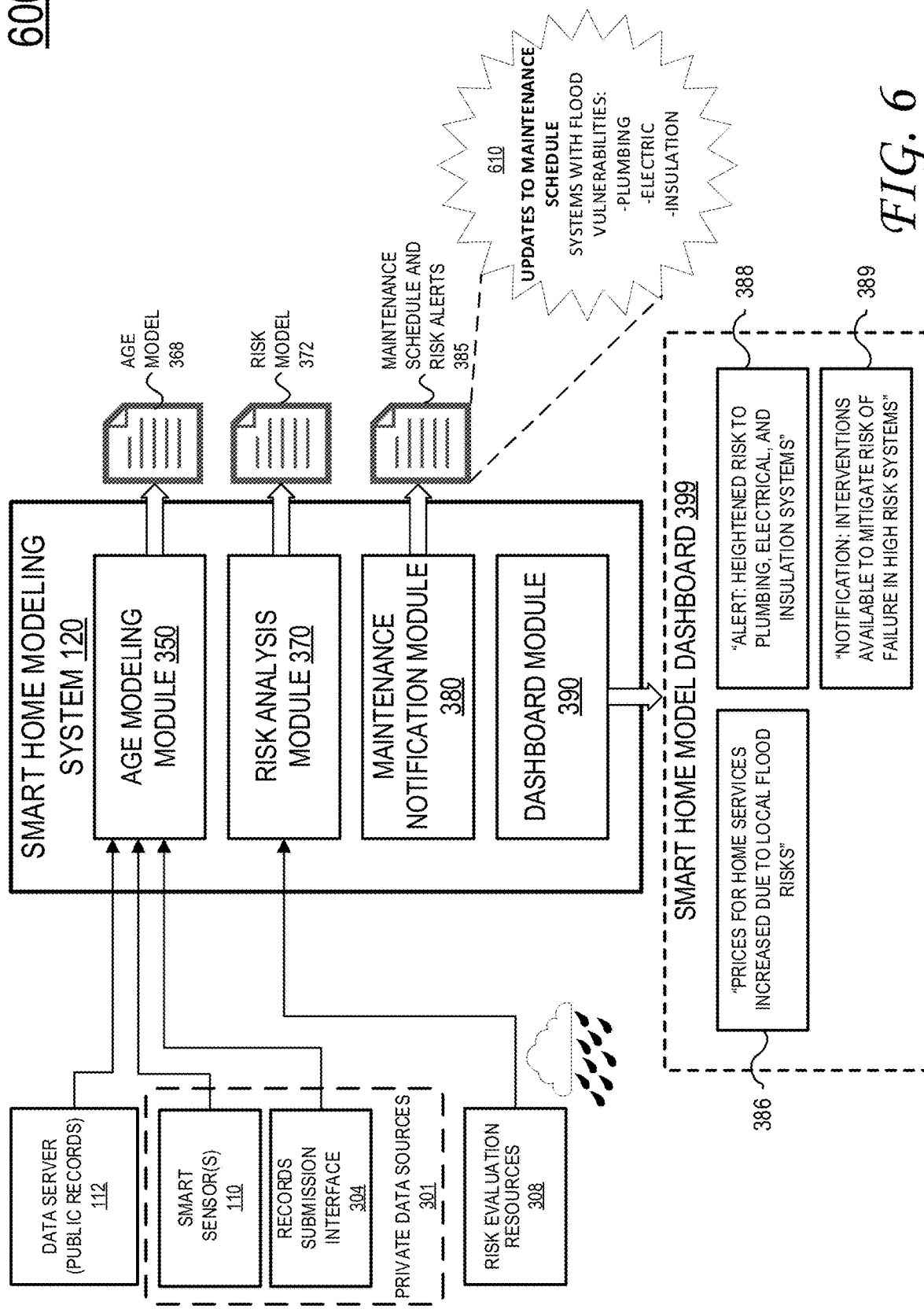

ALERT AND NOTIFICATION SUB-PANEL

PANEL 1

| OVERALL | HOME |
|---|---|
| OBJECTIVE AGE | 32 |
| EFFECTIVE AGE | 30 |
| ADJUSTED RISK | LOW (5-25%) |

MAINTENANCE AND RISK ADJUSTED PRICE QUOTE: $1,221

PRICING INTERVENTIONS AVAILABLE IN:
- ROOFING SYSTEM
- ELECTRICAL SYSTEM

MEDIUM (26-65%)   HIGH (66%-99%)

1022-1

PANEL 2

| SYSTEM | ROOFING |
|---|---|
| OBJECTIVE AGE | 15 |
| EFFECTIVE AGE | 22 |
| ADJUSTED RISK | LOW (5-25%) |

ALERT: TEMPERATURE SENSORS INDICATE POOR PERFORMANCE OF ROOFING

POSSIBLE INTERVENTIONS:
(1) PERFORM OVERDUE MAINTENANCE, OR (2) UPGRADE ROOFING

*USER CAN SAVE $422/year by performing overdue maintenance, and $844/year by upgrading*

MEDIUM (26-65%)   HIGH (66%-99%)

1022-2

PANEL 3

| SYSTEM | ELECTRICAL |
|---|---|
| OBJECTIVE AGE | 32 |
| EFFECTIVE AGE | 23 |
| ADJUSTED RISK | LOW (5-25%) |

PREVIOUS UPGRADES:
- UPGRADED TO SMART ELECTRIC BOX (USER RECORDS RECEIVED ON 1/4/2021)

POSSIBLE INTERVENTIONS:
- WATERPROOFING UPGRADES IN VIEW OF RECENT ELEVATED FLOOD WARNINGS

MEDIUM (26-65%)   HIGH (66%-99%)

1022-3

SYSTEMS AND METHODS FOR MODELING BUILDINGS AND RISK ASSESSMENT

TECHNICAL FIELD

The present disclosure relates generally to maintenance and management systems for buildings, and more particularly to comprehensive systems and processes for modeling buildings based on smart device data.

BACKGROUND

Conventional means for assessing the age of a building include contracting a trained professional such as a building inspector or an appraiser to physically inspect the building and premises. Such building inspectors or appraisers typically perform a limited number of inspections before making a report. From the conclusions and assessments of the reports, a building services advisor calculates multiple expenses. However, in-person building assessments may not accurately estimate the true condition of a building or its component systems. When static, single-source measurements of metrics of building age or building health are used as the basis for calculation of required maintenance and future anticipated costs, inaccuracies or incompleteness in the static measurements may omit crucial indications to a building owner that may affect the longevity of the building or the cost of maintaining the building. In other words, conventional building assessments may not be accurate or reflect the true age of a building.

A smart building environment includes smart devices, which can include electronic devices equipped with environmental sensors. In the smart building context, smart devices monitor and display information corresponding to the building environment, including the interior, exterior, and proximate surroundings. Smart devices add value to the experience of living or working in a building and provide insight into the surroundings. At present, consumers primarily use smart devices for automating interactions as well as collecting and reporting data to personal client devices, according to user-generated requests. However, opportunities exist for improving customer experiences and removing price inefficiencies caused by incomplete and inaccurate models of the true health of a building. These new challenges create opportunities to leverage technology and provide meaningful alerts and notifications that strike an appropriate balance between objective records data and measured sensor data from smart devices, in creating new building models.

BRIEF DESCRIPTION OF THE DRAWINGS

The embodiments herein may be better understood by referring to the following description in conjunction with the accompanying drawings in which like reference numerals indicate identical or functionally similar elements. Understanding that these drawings depict only exemplary embodiments of the disclosure and are not therefore to be considered to be limiting of its scope, the principles herein are described and explained with additional specificity and detail through the use of the accompanying drawings in which:

FIG. 3B illustrates a schematic block diagram of the smart home modeling system shown in FIG. 1, further showing outputs of the age modeling module, the risk analysis module, the maintenance notification module, and the dashboard module;

FIG. 6 illustrates a schematic block diagram of the smart home modeling system shown in FIG. 1, further showing example operations for generating dynamic pricing information for home services;

FIG. 7 illustrates an example virtual dashboard of the smart home modeling system.

DESCRIPTION OF EXAMPLE EMBODIMENTS

Overview

According to one or more embodiments of the disclosure, a smart home modeling system receives requests for improved models for various health metrics of a building and the systems that exist within the building. The system requests data containing baseline age information for the building from a first data source using a building identifier for the building. The system further receives information containing sensor data, relating to the current state of the building from a second data source. The system analyses the received sensor data over a time period. The system modifies the baseline age information based on the information relating to the current state of the building, including the received sensor data, to yield modified age information. The system uses the modified age information to generate a "true age" corrected age model for the home. These and other features will be discussed herein with respect to various exemplary embodiments of the disclosed smart home modeling system.

Description

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

As disclosed herein, the various systems, devices, and processes are described in the context of a "home." As used herein, the terms "home," "house," and/or "building" are used interchangeably and generally refer to a physical structure on a property, including residential homes and commercial buildings.

A smart home environment typically includes a communication network, which is a geographically distributed collection of devices or nodes interconnected by communication links and segments for transporting data there-between. The devices include, for example, electronic devices such as personal computers, laptops, tablets, mobile phones, as well as access points to the Internet, access points to private intranets, and the like. Many types of networks are available, ranging from local area networks (LANs) to wide area networks (WANs). LANs typically connect these nodes over dedicated private communications links located in the same general physical location, such as a building or campus. WANs, on the other hand, typically connect geographically dispersed nodes over long-distance communications links, such as common carrier telephone lines, optical lightpaths, synchronous optical networks (SONET), synchronous digital hierarchy (SDH) links, etc.

Figure 1:
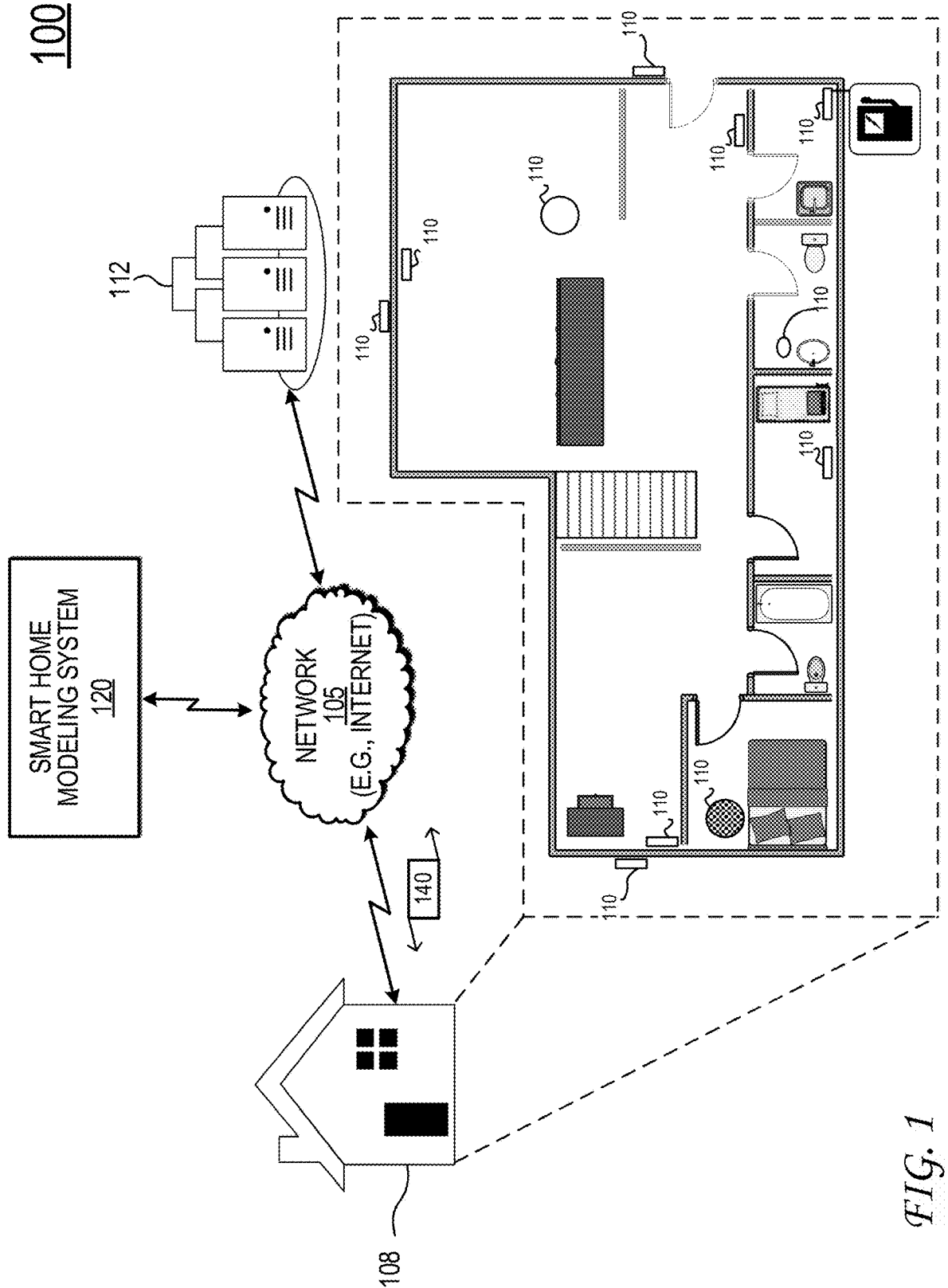
FIG. 1 illustrates a schematic diagram of an example smart home modeling system, including interconnected smart devices communicating over a network.

Referring to the figures, FIG. 1 illustrates a schematic diagram of a smart home environment 100, which includes an example communication network 105 (e.g., the Internet). Communication network 105 is shown for purposes of illustration and represents various types of networks, including local area networks (LANs), wide area networks (WANs), telecommunication networks (e.g., 4G, 5G, etc.), and so on.

As shown, communication network 105 includes a geographically distributed collection of devices or data sources, such as smart devices 110 and data server 112. Smart home 108 represents a smart home equipped with smart devices 110. Smart devices 110 are interconnected by communication links and/or network segments and exchange or transport data such as data packets 140 to/from a smart home modeling system 120.

Smart home 108 represents a home or building that contains a number of smart devices 110. In general, smart home 108 may be equipped with any number of smart devices.

Data server 112 is a data server storing databases containing information relating smart home 108 and its attributes. In particular, the system uses a property identifier such as an address or other encoding to retrieve or look-up information regarding a particular home at data server 112. Data server 112 represents public and/or private servers that interface with smart home modeling system 120. As an example, data server 112 can include a public or government data server with property records associated with smart home 108 (e.g., home construction records, etc.). Data server 112 can also include cloud processes or remotely-executing application instances relating to routine maintenance, or upgrades to systems of smart home 108, as discussed herein.

Data packets 140 represent network traffic or messages, which are exchanged between smart devices 110, data server 112 and smart home modeling system 120 over communication network 105 using predefined network communication protocols such as wired protocols, wireless protocols (e.g., IEEE Std. 802.15.4, WiFi, Bluetooth®, etc.), PLC protocols, or other shared-media protocols where appropriate. In this context, a protocol consists of a set of rules defining how devices or nodes interact with each other.

Smart devices 110 include a variety of sensors that monitor and quantify environment information relating to smart home 108 and report such information to smart home modeling system 120. Smart devices 110 can be positioned at opposing ends of smart home 108, positioned at/between pre-determined points of interest within smart home 108, positioned at linkage points where smart home 108 is connected to external utilities, positioned at selected locations outside the smart home 108, and so on. Smart devices 110 can also include mobile sensors that traverse areas within the smart home 108 and collect spatial data.

As shown in FIG. 1, smart home 108 is represented by a floorplan, showing different segments or rooms in the home. Smart home 108 can include a number of systems such as roofing, plumbing, heating, cooling, insulation, electrical, interior flooring, landscape, solar, and weatherproofing. Generally, smart home 108 has multiple systems whose health can be indicated and measured by sensor readings from smart devices.

As an example, smart devices 110 can include a smart doorbell, a smart thermostat, a smart climate monitor, a smart cleaning robot, a smart leak alerting device, a smart fire/smoke/CO2 detector, a smart sprinkler and other smart devices.

A smart doorbell collects audio-visual surveillance data from an audio sensor and a camera/image sensor when activated and may be used to periodically capture instant weather information using the camera sensor. A smart thermostat contains a temperature sensor that periodically records the ambient temperature, in addition to adjusting/monitoring the operation of heating and cooling within smart home 108. A smart climate monitor located within smart home 108 may be paired to another smart climate monitor located on an opposite side of a wall on the exterior of smart home 108. Smart climate monitors contain any combination of a temperature sensor, an air quality sensor, a wind speed sensor, and a humidity sensor. When paired, smart climate monitors may synchronously record measurements from their internal sensors, thereby capturing sensor readings associated with environmental attributes of the inside and the outside of a particular zone or region of smart home 108 (e.g., the west wing of the smart home 108). Even smart devices in separate homes can communicate and share information as permitted by owners to further the data collection and insights gained.

Smart devices 110 can further include a smart cleaning robot (e.g., a Roomba or comparable robotic cleaning machine) that can collect accurate information about the square footage of smart home 108 beyond the baseline information provided in objective records associated with smart home 108 (e.g., property records from a government/public data source hosted by data server 112). In particular, a smart cleaning robot may reveal the inclusion of add-on space that is being cleaned, but that is not reflected in outdated state/county government records retrieved from data server 112.

Smart devices 110 can also include a smart leak alerting device located near plumbing fixtures of smart home 108, and includes a moisture sensor that produces sensor readings indicative of whether a leak has occurred near the plumbing fixture. Sensor measurements indicating leaks can inform the smart home modeling system 120 about risks of failure or excessive wear/aging to the plumbing system of smart home 108. Additionally, smart devices 110 can include a fire/smoke/CO2 detector that contains a sensor that outputs measurements indicating the presence of fire, smoke, or excessive CO2 levels in a location of interest, such as a master bedroom. Smart devices 110 can also include a smart electric utility monitor coupled to a main electric box of smart home 108 that tracks electric utility usage, peak and average power draw, solar power generation, and general wear on the electric system of smart home 108.

Real-time sensor data output by smart devices 110 can be transmitted directly to smart home modeling system 120, or the sensor data may be periodically sampled, aggregated over time, and transmitted to smart home modeling system 120 as a part of a time-series of multiple temperature sensor readings recorded over an adjustable time interval. In this way, smart home modeling system 120 periodically receives sensor data representative of the environment of smart home 108 during a time interval. Smart home modeling system 120 can receive sensor data on a periodic basis, such as once an hour, once a day, once a week, and so on. Smart home modeling system 120 can analyze the sensor data received from smart home 108 over a period of days, weeks, months, or years.

FIG. 1 illustrates specific embodiments of smart devices 110, however it is appreciated that such smart devices in the broader sense are not limited to the illustrated embodiments. For example, smart devices 110 can include any number of electronic devices such as smartphones, laptops, embedded systems connected via the Internet of Things (IoT), environmental sensing platforms, and so on. In addition, those skilled in the art will understand that any number of devices and links may be used in communication network 105, and that the views shown by FIG. 1 are for simplicity and discussion.

Figure 2:
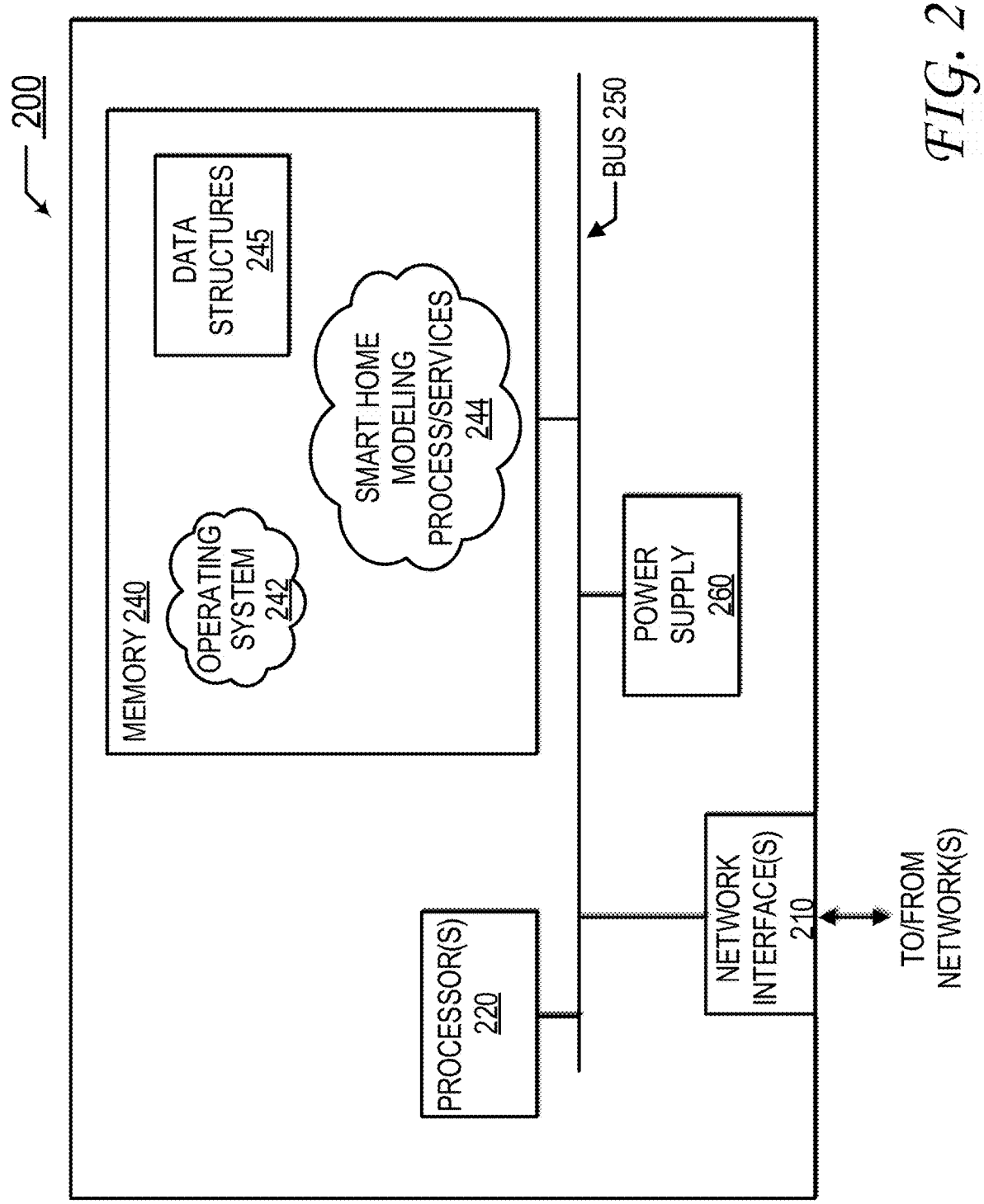
FIG. 2 illustrates a schematic diagram of an example smart home modeling device.

FIG. 2 is a schematic block diagram of an example device 200 that may be used with one or more embodiments described herein, e.g., as a component of smart home modeling system 120. Device 200 comprises one or more network interfaces 210 (e.g., wired, wireless, PLC, etc.), at least one processor 220, and a memory 240 interconnected by a system bus 250, as well as a power supply 260 (e.g., battery, plug-in, etc.).

Network interface(s) 210 contain the mechanical, electrical, and signaling circuitry for communicating data over the communication links coupled to communication network 105. Network interfaces 210 may be configured to transmit and/or receive data using a variety of different communication protocols. Network interfaces 210 are shown for simplicity, and it is appreciated that such interface may represent two different types of network connections, e.g., wireless and wired/physical connections. Also, while network interfaces 210 are shown separately from power supply 260, for programmable logic controllers (PLCs), the interface may communicate through power supply 260, or may be an integral component of the power supply. In some specific configurations the PLC signal may be coupled to the power line feeding into the power supply. In addition, it is appreciated that network interfaces 210 can be compatible with the Open Application Program Interface (API) specification to communicate with a variety of new devices, peripherals, etc.

Network interfaces 210 manage and receive connections from smart devices 110, which send sensor data indicative of the health and upkeep of various systems of smart home 108. In addition, network interfaces 210 can receive connections from inhabitants of smart home 108. By tracking the number of connections received from inhabitants of smart home 108, network interfaces 210 collect or generate statistics/metrics regarding the number of people inhabiting a home over a time period. Similarly, network interfaces 210 can track an activity level of each connection from inhabitants of smart home 108, as well as connection preferences associated with the inhabitants. By collecting statistics/metrics about network usage such as the number of inhabitants, an activity level associated with each inhabitant's connection, and connection preferences, network interfaces 210 can sense changes to the connection activity of smart home 108 and report such changes to smart home modeling services 244 (discussed in greater detail below).

Memory 240 comprises a plurality of storage locations that are addressable by processor 220 and network interfaces 210 for storing software programs and data structures associated with the embodiments described herein. Note that certain devices may have limited memory or no memory (e.g., no memory for storage other than for programs/processes operating on the device and associated caches).

Processor 220 comprises hardware elements or hardware logic adapted to execute the software programs (e.g., instructions) and manipulate data structures 245. An operating system 242, portions of which are typically resident in memory 240 and executed by the processor, functionally organizes device 200 by, inter alia, invoking operations in support of software processes and/or services executing on the device. These software processes and/or services may comprise smart home modeling process/services 244.

Data structures 245 contain reference databases of home modeling data, such as age modeling data and risk modeling data. These modeling data stored in data structures 245 include databases that provide smart home modeling system 120 with age adjustment models corresponding to certain sensor readouts or sensor readout characterizations. Additionally, modeling data stored in data structures 245 store databases that provide smart home modeling system 120 with risk adjustment models corresponding to certain sensor readouts, sensor readout characterizations, or sensor-corrected age models.

Data structures 245 can also store sensor measurements as they are received from smart devices. Sensor measurements from smart devices 110 may be received as a stream of single sensor readout measurements, or as time-series of multiple sensor readout measurements. Data structures maintaining a record of the received sensor measurements can be requested and received via one or more network interfaces 210, and subsequently stored, aggregated, and organized within storage for data structures 245 in memory 240.

Device 200 can be a smart home modeling computer system 120 that is communicatively coupled to smart home such as one of the smart devices 110 of FIG. 1. When device 200 is a smart home device, it may include one or more environment sensors 230. As described above in connection with FIG. 1, smart home modeling computer system 120 creates a model for a smart home 108. Smart home modeling processes/services 244 stored in memory 240 receive the sensor data used to create the model. In some embodiments, sensor data can include statistics/metrics about the network usage within smart home 108 collected by network interfaces 210. Network usage metrics collected by network interfaces 210 can indicate increased wear on smart home 108 and its systems (e.g., during time periods where network usage is elevated), or decreased wear on smart home 108 and its systems (e.g., during time periods where network usage is diminished). To simplify discussion of sensor data input to smart home modeling processes/services 244, it can be assumed that network interfaces 210 report network usage metrics along with smart devices 110.

As described above in connection with smart devices 110 of FIG. 1, sensor data can originate from sensors housed within smart devices 110 within or around smart home 108. Sensors of smart devices 110 may include a camera/image sensor within a smart doorbell, a temperature sensor in a smart thermostat, any temperature, air quality, wind speed, and humidity sensors in a smart climate monitor, a square footage monitor in smart cleaning robot, a sensor that outputs measurements indicating the presence of fire, smoke, or excessive $CO_2$ levels in a location of interest contained in a smart fire/smoke/CO2 detector, or a sensor to track electric utility usage, peak and average power draw, solar power generation, and general wear on the electric system of smart home 108 in a smart electric utility monitor.

Sensor readout measurements may be periodically sampled, updated, or otherwise received by network interfaces 210 and sent in a continuous stream to the smart home modeling process/services 244 of smart home modeling system 120. In such embodiments, smart home modeling system 120 may aggregate and format the stream of sensor readout measurements provided by network interfaces 210 into a time-series of measurement data. Such a time-series of measurement data can be aligned with other time-series and analyzed to determine holistic or systemic faults or risks of failure in home systems. In alternative embodiments, at least a portion of smart devices 110 self-aggregate sensor readout data and store formatted time-series that are conveyed to smart home modeling system 120, and stored in memory 240 (e.g., as data structures 245).

Note that while smart home modeling system 120 is shown as having some memory footprint in centralized memory 240 of device 200, it should be understood that smart home modeling system 120 operates on a remote computer system that has a network connection to device 200 via network interfaces 210. Alternative embodiments provide for the reporting of measurement data from environmental sensors 230 to be specifically operated within the network interfaces 210, such as a component of a MAC layer, and/or as part of a distributed computing network environment.

It will be apparent to those skilled in the art that other processor and memory types, including various computer-readable media, may be used to store and execute program instructions pertaining to the techniques described herein. Also, while the description illustrates various processes, it is expressly contemplated that various processes may be embodied as modules or engines configured to operate in accordance with the techniques herein (e.g., according to the functionality of a similar process). In this context, the term module and engine may be interchangeable. In general, the term module or engine refers to model or an organization of interrelated software components/functions.

As noted above, service providers providing a building owner services for the building (such as insuring the home, providing insurance for systems of the home, providing insurance against specific environmental risks to the home, etc.) may be lack accurate, real-time data leading to incorrect/incomplete assessments, when relying only on static information reports of the condition of a building that are rarely, if ever, updated. As a result, providers of building owner service providers may inadvertently provide inaccurate risk assessments to building owner that are insensitive to the current state of the building under evaluation. In such conventional arrangements, the building owner risks paying service rates corresponding to risk levels that are higher than the actual effective risk for certain systems of a building, and the service provider risks overlooking preventive or interventional measures a building owner can implement to prolong failure of certain building systems.

To generate improved models of building age and risk of failure, baseline age information that is received from a public data source (e.g., a public/government data server that stores building records associated with property identifiers) can be used to generate a baseline age model of smart home 118. Measured data, such as the environmental sensor readings from smart devices in a home/building, are aggregated for analysis and determination of the effectiveness of the house systems. Based on whether sensor readings indicate above average, average, or below average performance of the efficiency of a system, the baseline age data/model for the system is modified to produce a modified age data structure, sometimes referred to as an age model or a comprehensive age model. Additionally, the baseline age data for a system can be modified by user reports of maintenance or upgrade records to any particular system of the building/home.

A home model based solely on baseline age data suffers from many of the shortcomings of conventional home assessments. To remedy this deficiency, smart home modeling system 120 uses measured data, such as the environmental sensor readings from smart devices in a home/building, to modify the baseline age data. Sensor data, aggregated for analysis and determination of the effectiveness of the house systems, are analyzed for indications of above average, average, or below average performance of the efficiency of a system of a house. Baseline age data for the system of the house is modified to produce a modified age data structure representing the "true age" of smart home 108, sometimes referred to as an age model or a comprehensive age model. Additionally, the baseline age data for a system can be modified by user reports of maintenance or upgrade records to any particular system of the building/home.

Often, a homeowner is often unable to realize financial benefits that result from investments in upgrades or scheduled maintenance to certain systems of a home. In some instances, the homeowner is unable to have preventative care or service/upgrade records for home systems incorporated into the under-writing and pricing of home insurance quotes. In other instances, a homeowner is unaware of the service options available to prevent degradation of systems of the home. Conversely, a home service provider such as a home insurance provider is often unable to account for specific risk factors that may increase the likelihood of failure of particular systems in a home, without the ability to account for homeowner-submitted service/upgrade records or to receive smart home device data containing environmental sensor measurements specific to the home. Services associated with the homeowner of a smart home, such as a life insurance service or disability insurance service can also be negatively affected by inadequate or incomplete risk information associated with the primary residence of the homeowner.

Accordingly, the techniques described herein provide comprehensive smart home modeling services, as well as processes that monitor and analyze factors for aging and wear-related stresses associated with systems of the home. Smart home modeling is performed by modifying a baseline age data structure that is based on public records associated with a property identifier. By incorporating sensor measurements and dynamically received service/upgrade records into a determination of effective ages of both the home and its systems, the smart home modeling system generates an age model that accounts for the effective ages of the home and its system. Sensor measurements may be analyzed over a period of time when determining the effective ages of the home and the systems. Smart home modeling of a building associated with a property identifier also generates particular risk values for the home and its systems. These risk values represent a risk of failure of systems within the home, based on the sensor measurements and the user-submitted records. The age model and the risk model provide a more accurate assessment of the age of building and the risk of failure to its systems, compared to a conventional model that does not leverage sensor data from smart devices. Smart home modeling services provided by the system generate alerts and other messages on a dashboard for tracking the effects of sensor data from smart home device sensors, and service/upgrade records, on pricing of certain home services.

Alerts regarding potential maintenance or upgrade services that can mitigate risk of failure for systems of the smart home can be provided to the user, along with a projection of adjustments to the pricing model for services assuming completion of the services. Additionally, notifications are provided to the user about interventions that a homeowner can take, by performing certain maintenance or upgrades to systems of the smart home, to obtain pricing improvements on services or under-writing. While the techniques discussed herein focus, in part, on quantifying age-related wear on home systems as indicated by environmental sensor measurements, the techniques in the broader sense can quantify specific risks to home systems while smart devices operate within the home.

These processes are embodied by a smart home modeling system, which includes various systems, devices, and methods discussed herein. At a high level, the platform employs evaluation techniques to determine the effective age of a home based on a baseline age, smart home device sensor measurements, and homeowner-submitted records of upgrades/maintenance. The effective age of the home and its component systems is then used to evaluate an overall risk to the home and its systems, using baseline risk values, and smart device sensor measurements, and homeowner-submitted records of upgrades/maintenance. Baseline risk values for each of the home systems can be modified based on the "true age," or age model of the home, as well as using smart device sensor measurements and records of upgrades/maintenance. Risk associated with the home and its systems can be represented using a score indicative of a probability of failure or inoperability of a home system. As an example, a baseline risk score of a particular system may improve (e.g., the risk score may be lowered, indicating a lower probability of system failure/inoperability) when smart device sensor measurements and records of upgrades/maintenance indicate that the particular system has been functioning with above-average performance for a period of time, or if the particular system has been recently serviced/upgraded. Conversely, when smart device sensor measurements and records of upgrades/maintenance indicate that the particular system has been functioning with below-average performance for a period of time, or if the particular system has not been serviced/upgraded according to a recommended maintenance schedule, risk scores of the particular system may degrade (e.g., the risk score may be raised indicating a higher probability of system failure/inoperability). Finally, the overall risk values are used to provide alerts and intervention options to a user of a dashboard that displays age and risk-adjusted home and system metrics.

These smart home modeling techniques provide technical solutions for monitoring environmental sensors operating within smart devices in a home, analyzing the sensor measurement data in conjunction with user-submitted records to quantify age related wear (e.g., effective ages of home and systems) associated with systems whose performance can be measured by environmental sensors. Additionally, the home modeling techniques allow for identification of appropriate interventions to mitigate risk corresponding to the holistic home data that incorporates both static data from objective sources as well as periodically measured and updated data (e.g., user-submitted records and measurements from one or more environmental sensors). The technical solutions extend beyond the quantification of effective age estimation and corresponding risk adjustment, to providing appropriate alerts and notifications to change the user's behavior and improve the health of systems within the home.

Figure 3A:
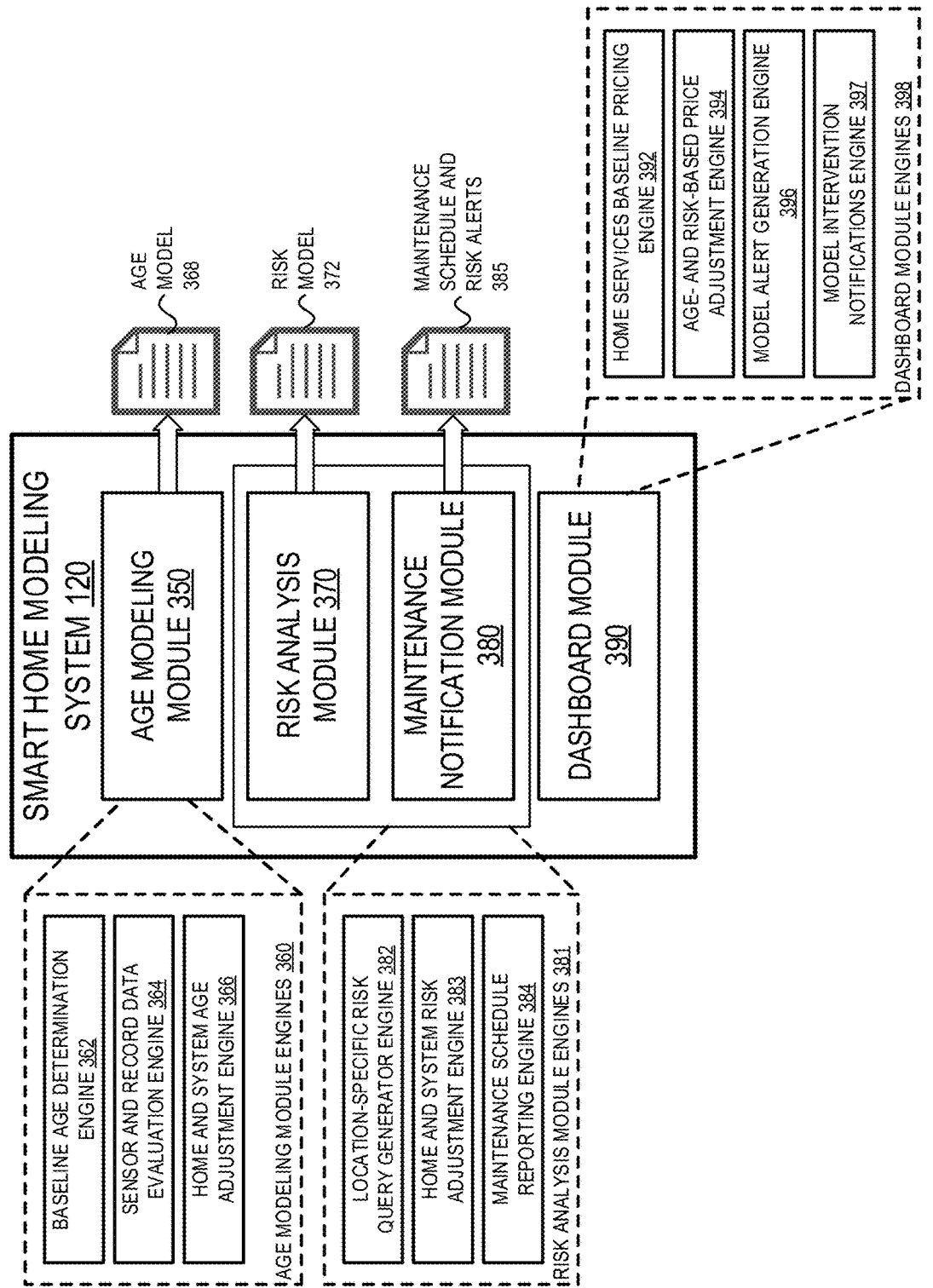
FIG. 3A illustrates a schematic block diagram of the smart home modeling system shown in FIG. 1, further showing an age modeling module, a risk analysis module, a maintenance notification module, a dashboard module, and their respective processing engines.

FIG. 3A illustrates a schematic block diagram 300 of smart home modeling system 120. Smart home modeling system 120 may execute on a remote server that communicates with smart devices 110 via network 105 of FIG. 1. As shown, smart home modeling system 120 includes a number of component modules or engines, such as an age modeling module 350, a risk analysis module 370, a maintenance notification module 380 and a dashboard module 390. In certain embodiments, the modules can be hosted on different respective servers as a part of a distributed computing network.

In operation, age modeling module 350 monitors data sources that provide information about smart home 108. Age modeling module 350 monitors received data over network 105 from private data sources and public/government data records, and processes the incoming data using age modeling module engines 360. Risk analysis module 370 and maintenance notification module 380 process risk evaluations and an age model generated by age modeling module 350 using risk analysis module engines 381. Dashboard module 390 uses dashboard module engines 398 to serve as an engagement tool, that displays the contents of a smart home model dashboard to a user of smart home modeling system 120.

Turning to age modeling module engines 360, a baseline age determination engine 362 first collects objective data from public/government data records stored in a data server 112 storing public records or other objective property records associated with property identifiers (illustrated in FIG. 3B) and any user/homeowner submissions received from records submission interface 304 (illustrated in FIG. 3B). Baseline age determination engine 362 then generates a baseline age data structure for the home that contains respective age indicators for the overall home as well as systems of the home, based on the objective data received from records submission interface 304 and public/government data records from data server 112 that stores and provides public records.

Objective age information retrieved from public/government data records from data server 112 that stores and provides public records relating to systems of the home, are modified based on user/homeowner submissions received from records submission interface 304. As an example, objective age information from public/government data records from data server 112 may indicate that the objective age of a roofing system is 15 years old. The objective age of the roofing system may be maintained (or, not adjusted/modified) in the baseline age data structure generated by baseline age determination engine 362 when homeowner submissions received from records submission interface 304 indicate that recommended services have been performed for the roofing system. The objective age of the roofing system may be decreased in the baseline age data structure when homeowner submissions received from records submission interface 304 indicate that more than the recommended services (e.g., upgrades) have been performed for the roofing system.

The objective age of the roofing system may be increased in the baseline age data structure when homeowner submissions received from records submission interface 304 indicate that less than the recommended services (e.g., maintenance lapses causing potential degradation) have been performed for the roofing system. Some submissions received from records submission interface 304 can improve the "true" or effective age of one home system in the age model, while degrading the "true" or effective age of another home system in the age model. As an example, adding solar panels to a roof may degrade the effective age of the roofing system in the age model (e.g., increase the age of the roofing system in the age model relative to a baseline value based on public records data from data server 112), and also improve the effective age of the electrical system (e.g., decrease the age of the electrical system in the age model relative to a baseline value based on public records data from data server 112).

Each system of the home may be evaluated using baseline age determination engine 362, which first determines an objective age value based on records from public/government data records from data server 112 that stores and provides public records. Once all systems have been evaluated by baseline age determination engine 362, a baseline age data structure containing the system ages produced by baseline age determination engine 362 is generated. The baseline age data structure also contains a baseline age for the overall home that is based on the system ages produced by baseline age determination engine 362.

Once generated by baseline age determination engine 362, the baseline age data structure, containing the baseline ages of the home and its systems, is conveyed to sensor and record data evaluation engine 364. Sensor and record data evaluation engine 364 aggregates sensor readout measurements from smart home sensors in smart devices 110, and organizes the sensor readout measurements into respective time-series data structures for each sensor.

As mentioned above in connection with smart home devices 110 of FIG. 1, sensor data from a building or home provides indications about the health of home systems. As an example, when correlated with temperature sensor readings from the exterior of the home, temperature readings collected from different regions within the home can provide indications about the health of the heating, cooling, insulation, and roofing systems of the home.

Sensor and record data evaluation engine 364 also aggregates homeowner records received at records submission interface 304. Service and upgrade records received at submission interface 304 are collected and sorted according to the system they pertain to. Then, the records are evaluated to determine whether they indicate additional wear, expected/recommended maintenance, or an improvement to the system.

Evaluations of home health or performance generated by sensor and record data evaluation engine 364 provide indications of above-average health, average health, or below-average health of particular home systems to home and system age adjustment engine 366. Home and system age adjustment engine 366 modifies the baseline age data structure produced by baseline age determination engine 362 based on the indications of home health generated by sensor and record data evaluation engine 364, to generate age model 368 with sensor- and records-corrected age values for the overall home and its systems.

Additionally, home and system age adjustment engine 366 can receive supplemental historical records and news by accessing data server 112 (e.g., when data server 112 hosts a historical records and/or news database) that receives property identifiers as search queries. Historical records, such as records of recent earthquakes, natural disasters, or other natural phenomena that could weaken the integrity of one or more home systems, can be received by engine 366 and used to determine a corresponding adjustment to the "true" or effective age of one or more home systems in the age model. As an example, if engine 366 receives historical records indicating that a certain geographic region associated with a building identifier was recently affected by an earthquake, the "true" or effective age of a foundation system associated with the building identifier can be increased in the age model (e.g., due to potential weakening of the foundation system during the earthquake).

News, such as press releases or public reports about building requirements (e.g., news from government/local building regulators), can also be received by engine 366 and used to determine a corresponding adjustment to the "true" or effective age of one or more home systems in the age model. As an example, if engine 366 receives news from a city government associated with mandated upgrades to buildings a building identifier, the "true" or effective age of a system associated with the building can be modified in the age model. As yet another example, a news story can include stories about risks to properties in a certain area constructed by a builder/developer who was found to have repeatedly violated county building codes, which can be interpreted to increase the "true" or effective age of a system associated with a home constructed by said builder/developer. In some embodiments, the builder/developer credentials associated with the construction of a home can be input as a search query to data server 112 hosting a track record checking service for home builders.

Age model 368 can sometimes be referred to as the "sensor-corrected age mode," the "records-corrected age model," the sensor- and records-corrected age model," or simply the "corrected age model." In some instances, sensor data from smart devices 110 may be unavailable and only records from records submission interface 304 are used to adjust the baseline age data structure produced by baseline age determination engine 362. Conversely, sometimes records from records submission interface 304 may be unavailable and only sensor data from smart devices 110 are used to adjust the baseline age data structure produced by baseline age determination engine 362.

Home and system age adjustment engine 366 also modifies the objective age values in the baseline age data structure when homeowner submissions received from records submission interface 304 indicate improvements or degradation to particular system. In cases where homeowner submissions received from records submission interface indicate expected or recommended maintenance to the system, baseline age determination engine 362 does not modify the objective age from public/government data records from data server 112.

As an example, home and system age adjustment engine 366 may increase the baseline age of a particular system when sensor data from smart home sensors in smart devices 110 indicates degradation or below-average health/performance of the particular system. Home and system age adjustment engine 366 may decrease the baseline age of a particular system when sensor data from smart home sensors in smart devices 110 indicates above-average health/performance of the particular system (based on the evaluation by sensor and record data evaluation engine 364). Home and system age adjustment engine 366 may maintain the baseline age of a particular system when sensor data from smart home sensors in smart devices 110 indicates average health/performance of the particular system (based on the evaluation by sensor and record data evaluation engine 364).

In this way, home and system age adjustment engine 366 produces an age model 368 with sensor- and records-corrected age values for the overall home and its systems based on the baseline age data structure produced by baseline age determination engine 362. Age model 368 may include a data structure containing a modified age value for each system of smart home 118 that accounts for indications of improvements, maintenance, and degradation to the respective system based on data received from private data sources 301.

Age model 368 may include age values for each system that are based on objective property records from public/government data records from data server 112, selectively modified (using baseline age determination engine 362) when homeowner records of services and upgrades from records submission interface 304 indicate improvements or degradation to the system, and then further modified (using home and system age adjustment engine 366) based on evaluations from sensor and record data evaluation engine 364. In this way, age modeling module 350 generates an age model 368 for the home that accounts for supplemental age and maintenance information received from private data sources 301, using engines 360. Age model 368 is then provided to risk analysis module 370.

Risk analysis module 370 receives age model 368 and additionally receives baseline risk data from external risk evaluation resources (308, as shown in FIG. 3B) that provide risk data for comparable houses based on age model 368 with age values for the home being modeled and its systems, based on sensor and records data. In other words, risk analysis module 370 requests risk data from external risk evaluation resources 308 for the overall home and its systems assuming respective ages derived from age model 368 with sensor- and records-corrected age values for the overall home and its systems. Risk analysis module engines 381, used by risk analysis module 370 and maintenance notification module 380 include location-specific risk query generator engine 382, home and system risk adjustment engine 383, and maintenance schedule reporting engine 384.

Risk analysis module 370 uses the risk data from risk evaluation resources 308 to generate a risk model 372 for the home and its systems, that contains probabilities of failure for the overall home and for each of the systems. Risk model 372 is generated assuming the overall home and the systems have ages as specified in age model 368 containing corrected age values based on sensor and records data. The system risk model is conveyed to a maintenance notification module 380. Maintenance notification module 380 receives the system risk model 372 generated by risk analysis module 370.

Based on the system risk model 372, a location-specific risk query generator engine 382 generates a query to external risk evaluation resources 308 for any available information about risks that are local to the home/building being modeled. In some embodiments, location-specific risk query generator engine 382 determines a geographic region associated with a property identifier corresponding to the home being modeled and generates a query requesting information from resources 308 about risks specific to the geographic region. In this way, location-specific risk query generator engine 382 determines additional risk factors for the home being modeled based on the location of the home.

As an example, a plumbing system may have a 50% risk of failure within 5 years, in the system risk model generated by risk analysis module 370. Location-specific risk query generator engine 382 may request information from public/government data records from data server 112 that stores and provides public records, or risk evaluation resources 308 to determine any additional risks to properties in the specific geographic region of the property. Location-specific risk query generator engine 382 may generate a query that causes the smart home modeling system 120 to receive information from records from data server 112 that stores and provides public records, or risk evaluation resources 308 indicating increased risk to plumbing systems in the geographic region of the property, and report a higher risk of failure within 5 years to maintenance schedule reporting engine 384. Home and system risk adjustment engine 383 is used to adjust the risk model 372 to reflect the increased risk to the plumbing system of the home.

Maintenance schedule reporting engine 384 may then convey information about a modified status of maintenance (e.g., a more urgent maintenance timeline) or additional maintenance needs (e.g., a specific upgrade to counteract the location-specific risks discovered by location-specific risk query generator engine 382) in view of the indication of increased risks from results of the query to risk evaluation resource 308 generated by location-specific risk query generator engine 382, using maintenance schedule reporting engine 384. In certain embodiments, maintenance schedule reporting engine 384 may convey a modified status of maintenance or additional maintenance needs directly to a user (via client devices or dashboard 399), or these reports may be conveyed to dashboard module 390. Additionally, in such embodiments, maintenance schedule reporting engine 384 can also convey the modified status of maintenance or additional needs to a provider of home services (e.g., an insurance provider or agent). As noted above, a modified status of maintenance could indicate a more urgent, or accelerated, maintenance timeline for services to a home system. When maintenance schedule reporting engine 384 reports a modified status of maintenance to a home services provider, additional flags corresponding to highlighted or elevated risk levels for certain home systems are also conveyed along with the modified status to alert the home services provider to the highlighted or elevated risk levels. Such flags could indicate that the highlighted or elevated risk levels for certain home systems require immediate attention (e.g., adjustment to the price of the home services) or automatic termination of home services (e.g., automatic termination of home insurance due to violation of terms).

Dashboard module 390 includes dashboard module engines 398. Dashboard module engines 398 include home services baseline pricing engine 392 which provides baseline data for a home being modeled, by referencing data structures 245 of FIG. 2 for baseline pricing information of services for comparable homes to the home being modeled. As an example, baseline pricing engine 392 may consult under-writing data structures to determine an optimal under-writing data structure to use as the basis for home insurance prices. Engine 392 is sometimes referred to as simply "pricing engine 392" or "baseline pricing engine 392," and can be understood to be an engine that generates queries for baseline price information for home services applicable to smart home 108 (e.g., price information associated with a particular property identifier).

Baseline pricing information retrieved by baseline pricing engine 392 is then conveyed to age- and risk-based price adjustment engine 394. Using age model 368 generated by age modeling module 350 and the system risk model generated by risk analysis module 370, age- and risk-based price adjustment engine 394 adjusts the baseline pricing information retrieved by baseline pricing engine 392. Adjusted pricing information generated by age- and risk-based price adjustment engine 394 of FIG. 3A is displayed using the pricing display 386 for the home model (e.g., age model 368, risk model 372, and report of maintenance schedule and risk alerts 385) shown in FIG. 3B.

As an example, if age model 368 generated by age modeling module 350 indicates increased ages for a number of systems of a home, age- and risk-based price adjustment engine 394 adjusts or increases the baseline pricing information for the home to account for the higher cost of insuring a home with degraded systems that are more prone to failure. Conversely, if age model 368 generated by age modeling module 350 indicates decreased ages for a number of systems of a home (e.g., due to homeowner records showing upgrades to the systems, or sensor data showing above-average health/performance of the systems), age- and risk-based price adjustment engine 394 adjusts the baseline pricing information for the home to account for the lower cost of insuring a home with improved systems that are less prone to failure.

Similarly, increased or decreased risk values indicated by the system risk model are also considered by age- and risk-based price adjustment engine 394 to adjust the baseline pricing information to account for the increased or decreased cost of insuring a home with improved/degraded systems that have a greater risk of failure.

Model alert generation engine 396 displays alerts regarding systems that may require maintenance or upgrade services that can mitigate the risk of failure of the systems. Alert display 388 for home and home system models (shown in FIG. 3B) provides these alerts to the user via dashboard 399. Model alert generation engine 396 analyses the system risk model 372 generated by risk analysis module 370 and the age model 368 to generate alerts to a user of dashboard 399 corresponding to systems requiring maintenance or upgrade services that would reduce the age of a particular home system in the age model 368, or that would reduce the risk/likelihood of failure of a particular home system in the system risk model. As an example, if sensor data from smart home sensors in smart devices 110 indicate below-average health/performance of a roofing system, an alert is provided by model alert generation engine 396 indicating that temperature sensors in smart home 108 indicate poor performance of the roofing system. Generally, model alert generation engine 396 may generate an alert to display via alert display 388 for home and home system models on dashboard 399, for particular systems where the system risk model indicates a risk/likelihood of failure that exceeds a pre-determined threshold value of risk. Alerts may be provided to the user on a dashboard for tracking the effects of dynamic data from smart home device sensors and homeowner/user-submitted maintenance and upgrade reports on pricing of certain home services.

Model intervention notifications engine 397 provides notifications regarding specific interventions that can be undertaken by a homeowner to reduce the cost of home services displayed on dashboard 399 via pricing display 386 for the home model. For systems that have an alert indicating risk exceeding a pre-determined threshold value of risk (e.g., systems with a corresponding alert on alert display 388 for home and home system models of dashboard 399), model intervention notifications engine 397 displays notifications relating to maintenance and other services that can reduce the excessive system risk of failure to levels below the pre-determined threshold of risk. As an example, if the model alert generation engine 396 generates an alert for the roofing system of a smart home 108 exceeding a pre-determined threshold value of risk, model intervention notifications engine 397 generates a notification indicating specific intervention services/upgrades that would reduce the risk of failure to the roofing system (e.g., notifications for intervention by performing maintenance for the roofing, or replacing the roofing). Additionally, model intervention notifications engine 397 projects costs to provide home services such as insurance using age- and risk-based price adjustment engine 394 to display projected savings resulting from the prescribed intervention services/upgrades being performed (e.g., savings when the roof receives a maintenance service, or when the roof is replaced).

Certain homes or properties have risk values (sometimes referred to as "risk scores") that exceed a predefined threshold of tolerable risk, for the purposes of providing home services. Dashboard 399 optionally includes an option to overwrite risk values/scores to bring the risk model for any of the home systems to a level below the predefined range of tolerable risk for each sub-system. By providing functionality to overwrite risk values/scores, dashboard 399 allows for homes or properties with a risk model indicating intolerable risk to receive projected pricing for home services. As an example, a smart home that includes a smart leak detector that indicates a leaking roof, or that has a records history indicating overdue maintenance, may have a risk of failure that exceeds a threshold of tolerable risk and prevents home services costs for the smart home to be projected. Dashboard 399 allows for the risk score for the roof system of the smart home to be overwritten, to a level below the threshold of tolerable risk, so that prices can be projected for the home that would not otherwise qualify for home services (e.g., home insurance, flood insurance, etc.).

FIG. 3B illustrates a schematic block diagram 310 of smart home modeling system 120, specifically showing inputs to system 120 and displays 386-389 of smart home model dashboard 399. Inputs to age modeling module 350 include smart devices 110, records submission interface 304, risk evaluation resources 308, and a data server 112 (e.g., a public/government data server storing objective records about properties that can be retrieved with a building identifier). Private data sources 301 include sensors from smart devices 110 that measure the health of systems of smart home 108, as described above in connection with FIG. 1.

Here, sensor data includes one-time measurements, measurement streams, data streams, or aggregated time-series of sensor readouts. Sensor readouts provided to the age modeling module 350 may include readouts from any of the smart devices 110, such as: a camera/image sensor within a smart doorbell, a temperature sensor in a smart thermostat, temperature, air quality, wind speed, and humidity sensors in a smart climate monitor, a square footage monitor in a smart cleaning robot, a sensor that outputs measurements indicating the presence of fire, smoke, or excessive $CO2$ levels in a location of interest contained in a smart fire/smoke/$CO2$ detector, or a sensor to track electric utility usage, peak and average power draw, solar power generation, and general wear on the electric system of smart home 108 in a smart electric utility monitor.

Additionally, age modeling module 350 receives private data records containing records data from a records submission interface 304. Records submission interface 304 can include a homeowner interface that receives private records submitted by a user or homeowner associated with a particular property or building. Records submitted by users or homeowners through records submission interface 304 are evaluated for indications of improvement, maintenance, or degradation of particular systems of the building or home. Evaluations of records submitted through records submission interface 304 are considered objective data values, as they relate to services that have already been performed on the building or home under evaluation.

Public or government data records from data server 112 that stores and provides public records provide additional objective property records. Property records from public or government data records may be requested from data server 112 by sending a property or building identifier to the data server 112 as a search query. In response, data server 112 returns objective property records associated with the property or building identifier. As an example, a property or building identifier can be an address associated with a home or building. Objective property records received from public or government data records of data server 112 are used to generate a baseline of age and risk information associated with a home.

Age modeling module 350 monitors received data over network 105 from private data sources 301 and public/government data records of data server 112, and processes the incoming data using age modeling module engines 360 (illustrated in FIG. 3A). As mentioned above in connection with home and system age adjustment engine 366, data server 112 can host a historical records and/or news database, and provide age modeling module with relevant historical records or news pertaining to the property identifier or a geographic region associated with the property identifier. Any historical records or news received is used to adjust the "true" or effective age of any affected home systems in the age model.

Age modeling module 350 can collect and analyze received data over a period of time, such as over a period of one month, one year, and so on. Risk analysis module 370 and maintenance notification module 380 process the age model 368 and risk model 372 using risk analysis module engines 381 (discussed above in connection with FIG. 3A).

Maintenance notification module 380 generates a report of maintenance and risk alerts 385, which is a document detailing alerts for systems of the home that have an elevated risk of failure, as well as a schedule of maintenance to those systems that is based on the services/upgrades already performed, as well as any specific risks to the systems (e.g., based on specific risk information from risk evaluation resources 308). Dashboard module 390 is used as an engagement tool to display the contents of smart home model dashboard 399 to a user of smart home modeling system 120. Dashboard 399 includes a pricing display 386 for the home model, where prices associated with taxes and services for a particular home/building associated with a property identifier are displayed.

Dashboard 399 also includes an age/risk display for home and system models 387, where the baseline age, effective age from age model 368, and risk levels from risk model 372 are displayed for the overall home as well as its systems. Dashboard 399 also includes an alert display 388 for home and home system models, where alerts are presented/delivered to a user of dashboard 399 when a risk value in risk model 372 associated with a system of the home exceeds a pre-defined threshold value of risk. Dashboard 399 also includes a notification display 389 for home system interventions, where notifications about maintenance a user or owner of the home can perform to lower risks identified in the risk model 372 and report of maintenance and risk alerts 385 are displayed.

Dashboard module 390 receives the system risk model generated by risk analysis module 370 as well report of maintenance and risk alerts 385 (including location-specific updates for maintenance status and needs relating to systems of the home, generated by maintenance notification module 380). Dashboard module 390 generates and delivers a smart home model dashboard 399, using dashboard module engines 398 (discussed above in connection with FIG. 3A).

Smart home model dashboard 399 displays "effective age" data values for each system corresponding to age model 368 generated by age modeling module 350, and also displays "adjusted risk" data values for each system corresponding to the system risk model generated by risk analysis module 370. Dashboard 399 also displays an "effective age" data value for the overall home, as well as an adjusted risk data value for the overall home. The effective age and risk values for the home being modeled are displayed via the age/risk display for home and system models 387.

End-to-End Example #1

Figure 4:
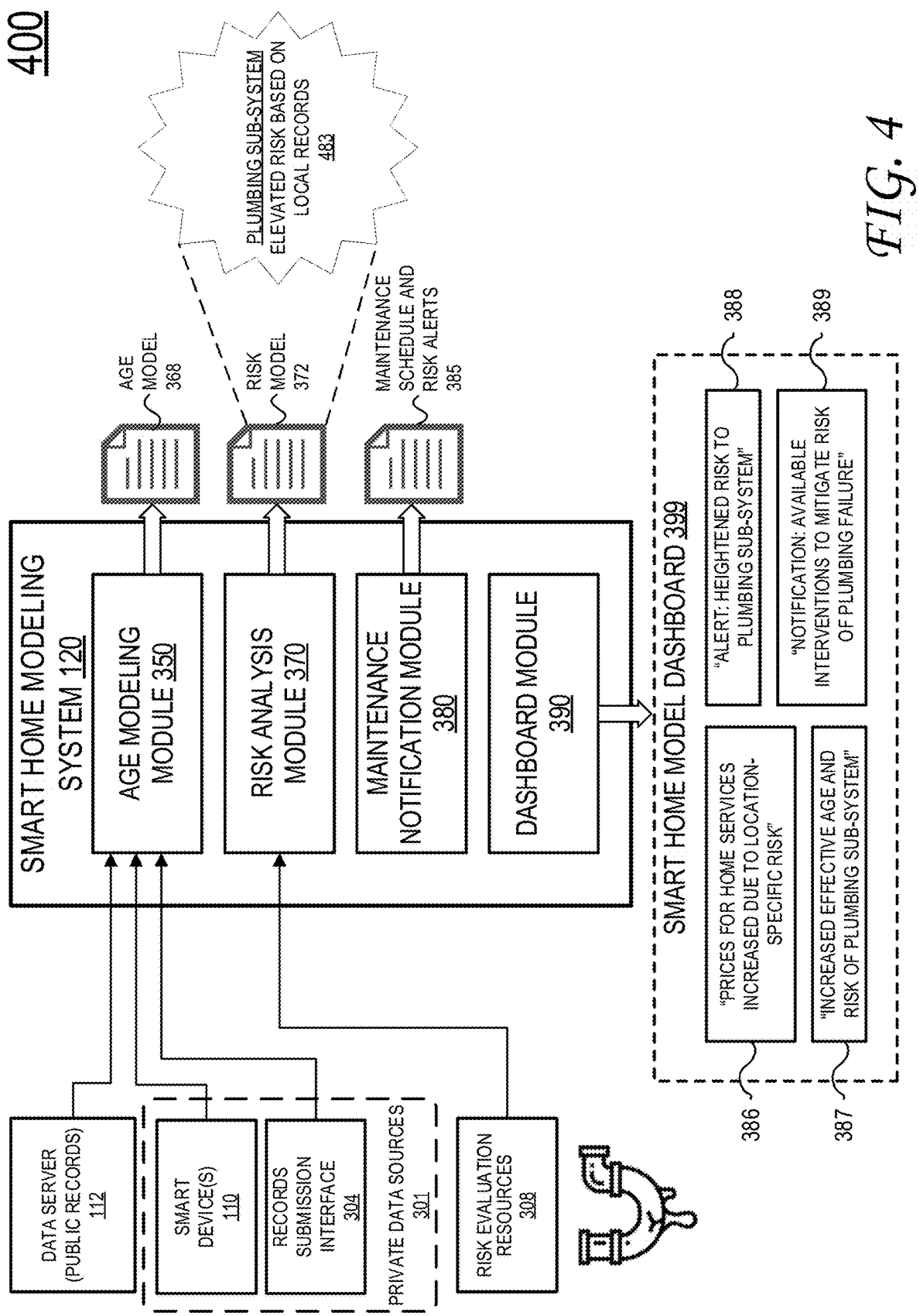
FIG. 4 illustrates a schematic block diagram of the smart home modeling system shown in FIG. 1, further showing example operations for generating alerts and notifications on a dashboard.

FIG. 4 illustrates a schematic block diagram of the smart home modeling system 120 shown in FIG. 2, further showing example operations for generating alerts and notifications on a dashboard responsive to location-specific risk determination. In this example, a smart home modeling system 120 may be set up for a home that has been recently purchased. The recently purchased home may be provided with any number of smart devices 110 as shown in FIG. 1. Specifically, the recently purchased home may include a smart leak alerting device that houses a sensor that measures leaks or unexpected moisture levels in the vicinity of a smart device 110 (e.g., a smart leak alerting device).

Age modeling module 350 of smart home modeling system 120 begins by receiving public home and plumbing records from public or government data records of data server 112. Age modeling module also receives data from private data sources 301, namely plumbing service records from records submission interface 304 and leakage sensor data from smart home sensors in smart devices 110 (e.g., the sensor housed in smart device 110 such as a smart leak detector). Age modeling module 350 processes the received information from private data sources 301 and public/government data records of data server 112, and determines that the received information does not indicate abnormal aging to the plumbing system of the home. As examples, leakage sensor data from sensors in smart devices 110 may indicate zero or a tolerable number of leaks over a particular time interval, and plumbing service records from interface 304 may indicate expected or recommended levels of maintenance being performed on the plumbing system.

Because age modeling module 350 has no indications from sensor data or record data about possibly degraded performance of the plumbing system, the baseline age values determined from the public home and plumbing records provided by public/government data records of data server 112 are unchanged in age model 368 generated by age modeling module 350.

Similarly, risk analysis module 370 requests risk data from risk evaluation resources 308 and does not alter the risk data for systems of the home, due to the absence of indications of performance or maintenance variations (e.g., indications from private data sources 301 that any system has a higher likelihood of failure relative to risk data from the risk evaluation resources 308). When the risk model 372 generated by risk analysis module 370 is conveyed to maintenance notification module 380, location-specific risk query generator engine 382 searches for any location-specific risks to systems of the home.

Location-specific risk query generator engine 382 generates a query that requests information from public data sources about risks to homes in the geographic region of the home being modeled by system 120. In this example, location-specific risk query generator engine 382 discovers a location-specific risk factor 483 that indicates increased rates of plumbing failure associated with homes in the geographic region of the home being modeled by system 120 (e.g., news feeds and permit requests from the local town the home is located in). Accordingly, risk model 372 is upgraded to reflect the location-specific risk factor 483 that indicates an elevated risk of failure in the plumbing system. Additionally, maintenance schedule and risk alerts 485 are generated by maintenance notification module 380.

Location-specific risk factor 483 is conveyed to dashboard module 390. Module 390 updates smart home model dashboard 399 to reflect the discovery of location-specific risk factor 483 by location-specific risk query generator engine 382. In particular, age- and risk-based price adjustment engine 394 updates the price displayed for home services for the home being modeled, by increasing the price of insurance services from baseline values retrieved by baseline pricing engine 392 (shown on pricing display 386 for the home model) due to the specific risk (e.g., increased likelihood of failure) posed to the plumbing system of the home by location-specific risk factor 483. Additionally, age/risk for home and system models display 387 shows that the effective age and risk of the plumbing system is increased. Furthermore, model alert generation engine 396 alerts a user of dashboard 399 to the increased risk to the plumbing system in the home due to location-specific risk factor 483, via alert display 388 for home and home system models. Finally, model intervention notifications engine 397 notifies a user of dashboard 399 of interventions to the plumbing system of the home that can reduce risk of failure of the plumbing system (e.g., service intervention, or plumbing component replacements) via notification display 389 for home system interventions.

End-to-End Example #2

Figure 5:
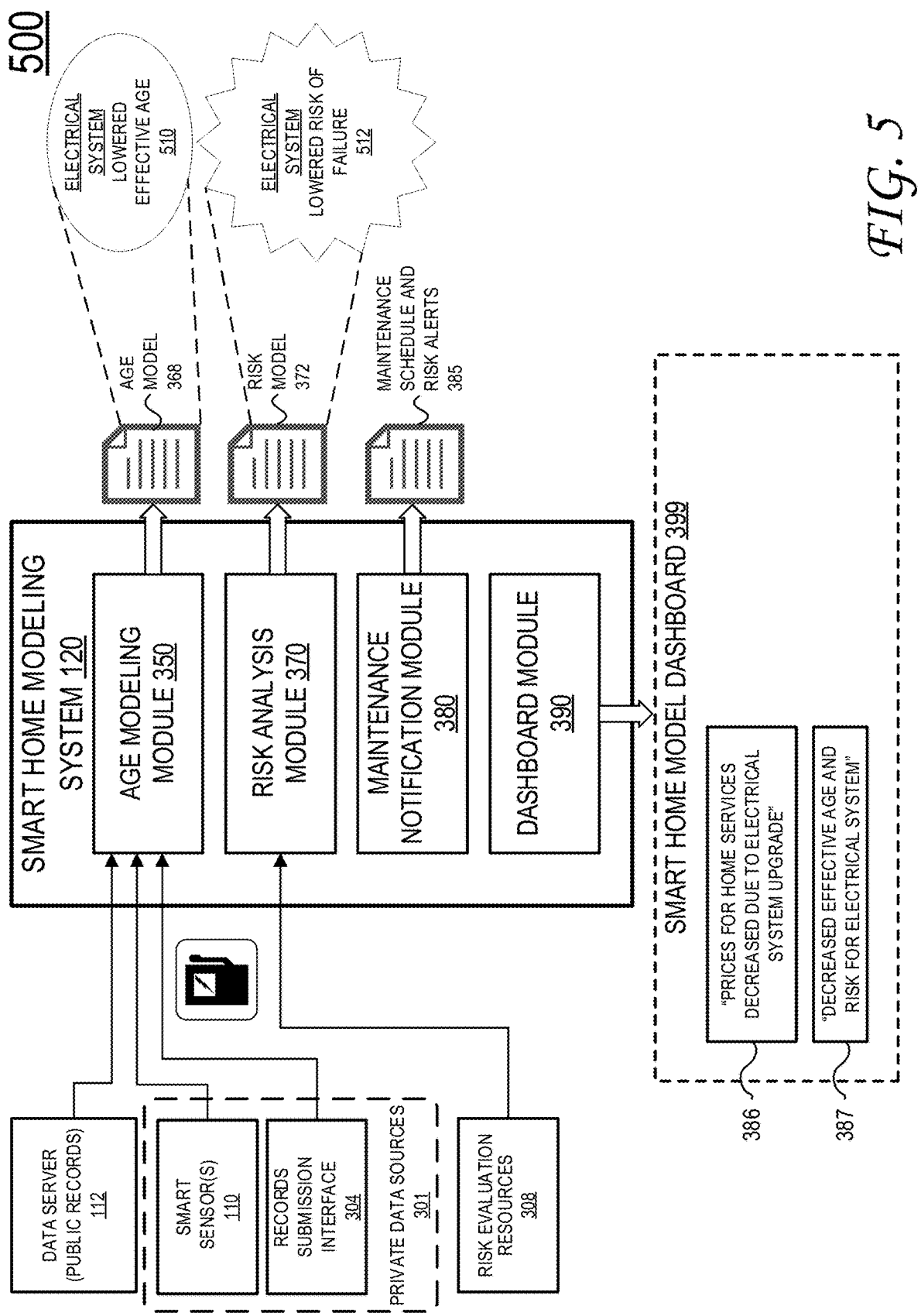
FIG. 5 illustrates a schematic block diagram of the smart home modeling system shown in FIG. 1, further showing example operations for updating age and risk models.

FIG. 5 illustrates a schematic block diagram of the smart home modeling system 120 shown in FIG. 2, further showing example operations for updating age and risk models responsive to determination of upgrades performed to a home. In this example, a smart home modeling system 120 may be set up for a home that has been recently upgraded. The recently purchased home may be provided with any number of smart devices 110, as described above in FIG. 1. Specifically, the recently upgraded home may include a smart electric utility monitor (illustrated in FIG. 1 coupled to the electric box of smart home 100*b*). A smart device 110 such as a smart electric utility monitor houses an electric utility sensor that measures power leaks, peak power usage, usage patterns, and wear levels associated with an electric box of smart home 100*b*.

Age modeling module 350 of smart home modeling system 120 begins by receiving baseline data about the age of the home and its systems from public/government records of data server 112 associated with the home being modeled. In this example, data from public/government records of data server 112 does not include any indication that the electric box of the home has been upgraded (e.g., public/government data records of data server 112 are outdated and do not accurately reflect the current state of the house). Instead, age modeling module 350 receives records indicating the upgraded smart electric box from private data sources 301. Specifically, a user or homeowner submits an upgrade record for the smart electric box through records submission interface 304. Alternatively, smart device 110 (e.g., a smart electric utility monitor) can detect the upgraded electric box it is coupled to and report the upgrade information as sensor data from a sensor from the smart device. After receiving the upgrade records associated with the electric box through records submission interface 304, age modeling module 350 commences operation of the age modeling module engines 360.

Baseline age determination engine 362 detects the indication of an upgrade to the electrical system of the home received through records submission interface 304. As a result, the baseline age of the electrical system of the home is modified to generate a corrected age that is lower than the objective baseline age of the electrical system as determined from the objective baseline data received from public/government data sources of data server 112. In some embodiments, home and system age adjustment engine 366 may perform the adjustment of the objective baseline age to the corrected age when smart home sensors in smart devices 110 report the upgrade of the electric box (e.g., when smart device 110 such as a smart electric utility monitor produces sensor readouts or outputs indicating an upgrade to the electric box of smart home 108).

As a result of the objective baseline age of the electric system of the home being modified to a corrected age (sometimes referred to as an "effective age"), corrected age model 368 generated by age modeling module 350 reflects a lowered effective age 510 of the electrical system of the home being modeled by smart home modeling system 120. The corrected age model 368 with a lowered effective age of the electrical system is then conveyed to risk analysis module 370.

When requesting risk data from risk evaluation resources 308, risk analysis module requests risk data for an electrical system having the lowered effective age of the system reported by age modeling module 350 in age model 368. As a result, the system risk model 372 generated by risk analysis module 370 indicates a lowered risk 512 of electrical system failure based on the lowered effective age of the system. In this way, data from private data sources 301 impacts both the effective age of the electrical system through the lowered age of the electrical system in age model 368, as well as the risk model 372 of the home through the lowered risk associated with the electrical system. Additionally, maintenance schedule and risk alerts 585 are generated by maintenance notification module 380.

Dashboard module 390 then receives the system risk model 372 generated by risk analysis module 370. Due to the lowered effective age 510 and lowered risk 512 associated with the electrical system, dashboard module 390 adjusts the pricing of baseline pricing information retrieved using home services baseline pricing engine 392. Specifically, smart home model dashboard 399 reports a decreased price relative to the baseline price for home services associated with the home being modeled, responsive to the upgrade records/indication for the electric box received from private data sources 301.

In particular, dashboard module 390 updates the price displayed for home services for the home being modeled, by decreasing the price of insurance services from baseline values retrieved by baseline pricing engine 392 (shown on pricing display 386 for the home model) due to the lowered risk (e.g., decreased likelihood of failure) posed to the electrical system of the home by the upgrade. Additionally, age/risk for home and system models display 387 shows that the effective age and risk of the electrical system is decreased.

In this way, submission of user-provided data such as records received through submission interface 304 can enable homeowners to lower effective age values and effective risk values associated with systems of their home, thereby receiving price reductions on home services such as insurance of the electrical system or insurance of the overall home.

End-to-End Example #3

FIG. 6 illustrates a schematic block diagram of the smart home modeling system 120 shown in FIG. 2, further showing example operations for generating dynamic pricing information for home services on a dashboard responsive to location-specific weather risks. In this example, a smart home modeling system 120 may be set up for a home that has with any number of smart devices 110 as shown in FIG. 1.

Age modeling module 350 of smart home modeling system 120 begins by receiving baseline data about the age of the home and its systems from public/government records of data server 112 associated with the home being modeled. Age modeling module 350 also receives data from private data sources 301, namely smart device sensor data from smart home sensors in smart devices 110, and service/upgrade records from records submission interface 304. Private data sources 301, in FIG. 6, indicate average performance associated with systems of the home based on values received from smart home sensors in smart devices 110, and further indicate expected or recommended levels of servicing to systems of the home based on records received from submission interface 304.

Because private data sources 301 provide data that indicate average performance of systems and expected/recommended levels of servicing to the systems (in other words, data from sources 301 do not indicate particularly improved or degraded performance of any systems of the home), age modeling module 350 generates an age model 368 that is substantially unmodified relative to the objective age data retrieved and determined based on public/government data records of data server 112. In other words, when private data sources 301 indicate average performance of systems and expected/recommended levels of servicing to the systems, age modeling module 350 generates an age model 368 that does not contain adjustments to the respective objective baseline ages of the systems of the home being modeled by system 120.

Objective baseline ages of the home systems are stored in age model 368 and provided to risk analysis module 370, which requests risk evaluations from risk evaluation resources 308 using location-specific risk query generator engine 382 (described above in connection with FIG. 3B). In this example, risk evaluations from resources 308 indicate dynamic flood risks to the geographic region of the property (e.g., flood risks that change by the hour, day, or week). Risk analysis module 370 monitors the dynamic flood risks provided by risk evaluation resources 308 and updates the system risk model 372 to reflect the increased risk of failure to systems affected by flooding.

Table 1 lists systems of smart home 108, respective objective attributes, and vulnerabilities associated with the systems that can be exposed by sensor data from smart devices 110 (e.g., wear) or service/upgrade records associated with the home (e.g., incomplete maintenance records).

TABLE 1

| Building System | Attributes | Vulnerabilities (risk factors) |
| --- | --- | --- |
| Roofing | Roof materials, age of installation, time elapsed since last maintenance, weather protective and insulating ability | Excessive age, incomplete maintenance records, high winds, heavy rainfall, storms, hurricanes, earthquakes, fires, natural disasters |
| Plumbing | Pipe materials, age of installation, number of failures/leaks | Excessive age, wear, incomplete maintenance records, public utility failure, flooding, natural disasters |
| Heating | Efficiency of heating, energy consumption, usage patterns, time elapsed since last servicing | Excessive age, wear, incomplete maintenance records, public utility failure, natural disasters |
| Cooling | Efficiency of heating, energy consumption, usage patterns, time elapsed since last servicing | Excessive age, wear, incomplete maintenance records, public utility failure, natural disasters |
| Insulation | Number and area of gaps (e.g., windows, doorways), insulation materials, efficiency of heating/cooling, energy consumption | Excessive age, flooding, natural disasters |
| Electrical | Efficiency of equipment, peak load, number of outages, home circuit overload, usage patterns | Excessive age, wear, incomplete maintenance records, public utility failure, flooding, natural disasters |
| Interior flooring | Interior square footage, materials, age | Excessive age, wear |
| Landscape | Exterior square footage, water consumption, age | Wear |
| Solar | Number and size of panels, battery size, panel age, inverter age | Same as Roofing |
| Weatherproofing | Type of hazard protection | Fires, storms, hurricanes, natural disasters |

As shown in Table 1 above, the plumbing, electric, and insulation systems of a home are considered to have vulnerabilities to flooding.

In response to receiving a system risk model 372 containing indicators of increased risk to the plumbing, electric, and insulation systems due to dynamic flood risk evaluations, maintenance notification module 380 commences the operation of engines of risk analysis module engines 381. Location-specific risk query generator engine 382 (pictured in FIG. 3B) confirms and corroborates the dynamic flood risks provided by risk evaluation resources 308. Maintenance schedule reporting engine 384 then prescribes changes to the report of maintenance schedule and risk alerts 385 for systems affected by the increased risk due to flooding. Consulting a table of systems and their respective vulnerabilities such as Table 1, maintenance notification module 370 generates and conveys information about a modified status of maintenance (e.g., a more urgent maintenance timeline) or additional maintenance needs (e.g., a specific upgrade to counteract the location-specific risks) in view of the indication of increased risks from location-specific risk query generator engine 382 or risk evaluation resources 308. This generated information is represented by update 610 to report of maintenance and risk alerts 385.

Dashboard module 390 receives the system risk model 372 from risk analysis module 370 as well as an updated report of maintenance and risk alerts 385 from maintenance notification module 380. In response to receiving the current system risk model 372 and an updated report of maintenance and risk alerts 385, dashboard module proceeds to make changes to smart home model dashboard 399. As mentioned above in connection with FIG. 3B, home services baseline pricing engine 392 references data structures 245 of FIG. 2 for baseline pricing information of services for comparable homes to the home being modeled. In this example, baseline pricing engine 392 may consult under-writing data structures to determine a particular optimal under-writing data structure to use as the basis for home insurance prices.

In particular, age and risk-based price adjustment engine 394 updates the price displayed for home services for the home being modeled, by increasing the price of insurance services from baseline values retrieved by baseline pricing engine 392 (shown on pricing display 386 for the home model of FIG. 6) due to the elevated risk (e.g., increased likelihood of failure) posed to the plumbing, electrical, and insulation systems of the home by the dynamic flood risks. Furthermore, model alert generation engine 396 alerts a user of dashboard 399 to the increased risk to the electrical, plumbing, and insulation systems in the home due to the dynamic flood risks, via alert display 388 for home and home system models. Finally, model intervention notifications engine 397 notifies a user of dashboard 399 of interventions to the plumbing system of the home that can reduce risk of failure of the plumbing system (e.g., service intervention, or plumbing component replacements) via notification display 389 for home system interventions.

Within dashboard 399, age- and risk-based price adjustment engine 394 increases the price from the baseline price retrieved from baseline pricing engine 392 and displays these increased prices via pricing display 386 for the home model, based on the dynamic flood risks reflected in the current system risk model 372 and updated report of maintenance and risk alerts 385. Model alert generation engine 396 alerts a user of dashboard 399 to heightened risk to the flooding affected systems via alert display 388 for home and home system models, and model intervention notifications engine 397 notifies the user of interventions (e.g., maintenance services or upgrades) that can be used to mitigate risk to the flooding affected systems via notification display 389 for home system interventions.

FIG. 7 shows an exemplary dashboard 700 similar to smart home model dashboard 399 of FIGS. 3B, 4, 5, and 6. Dashboard 700 includes three panels, with panel 1 representing the overall home, panel 2 representing the roofing system, and panel 3 representing the electrical system. In each panel, the system is identified and an objective age is provided. The objective age displayed on dashboard 700 is derived from objective property records of the overall home and its systems obtained by age modeling module 350 of the preceding figures.

Each panel of dashboard 700 also includes an effective age field. The objective age displayed on dashboard 700 is derived or otherwise based on the age model 368, and represents an adjusted age accounting for indications of performance of the systems from smart home sensors in smart devices 110, and indications from service and upgrade records from records submission interface 304.

Each panel of dashboard 700 provides a visual representation of the adjusted risk of failure requiring service/replacement of a particular system. Adjusted risk of failure refers to the risk values produced by system risk model accounting for particular risks to the systems, as well as effective ages of the systems from age model 368. A slider 1022-1 shows an adjusted risk level for the overall home. Slider 1022-2 shows an adjusted risk level for the roofing system. Slider 1022-3 shows an adjusted risk level for the electrical system.

Dashboard 700 displays alerts and notifications respectively generated by model alert generation engine 396 and model intervention notifications engine 397 in a dedicated alert and notification sub-panel. In panel 1, an updated pricing model for the home is presented with a "maintenance and risk adjusted price quote" representing the adjusted pricing information generated by age- and risk-based price adjustment engine 394. Because panel 1 displays information for the overall home, references to interventions that can affect pricing are also included in the alert and notification sub-panel.

In panel 2, an alert generated by model alert generation engine 396 is displayed on dashboard 700. The alert relates to a condition of poor performance indicated by smart device sensor data from smart home sensors in smart devices 110. In conjunction with the alert, notifications are displayed regarding interventions generated by model intervention notifications engine 397. In particular, the interventions include information from the maintenance status and needs of the systems generated by maintenance notification module 380 and maintenance schedule reporting engine 384. In addition to the displayed interventions, dashboard module 390 may display projected price savings that would result from the interventions being taken.

Figure 8:
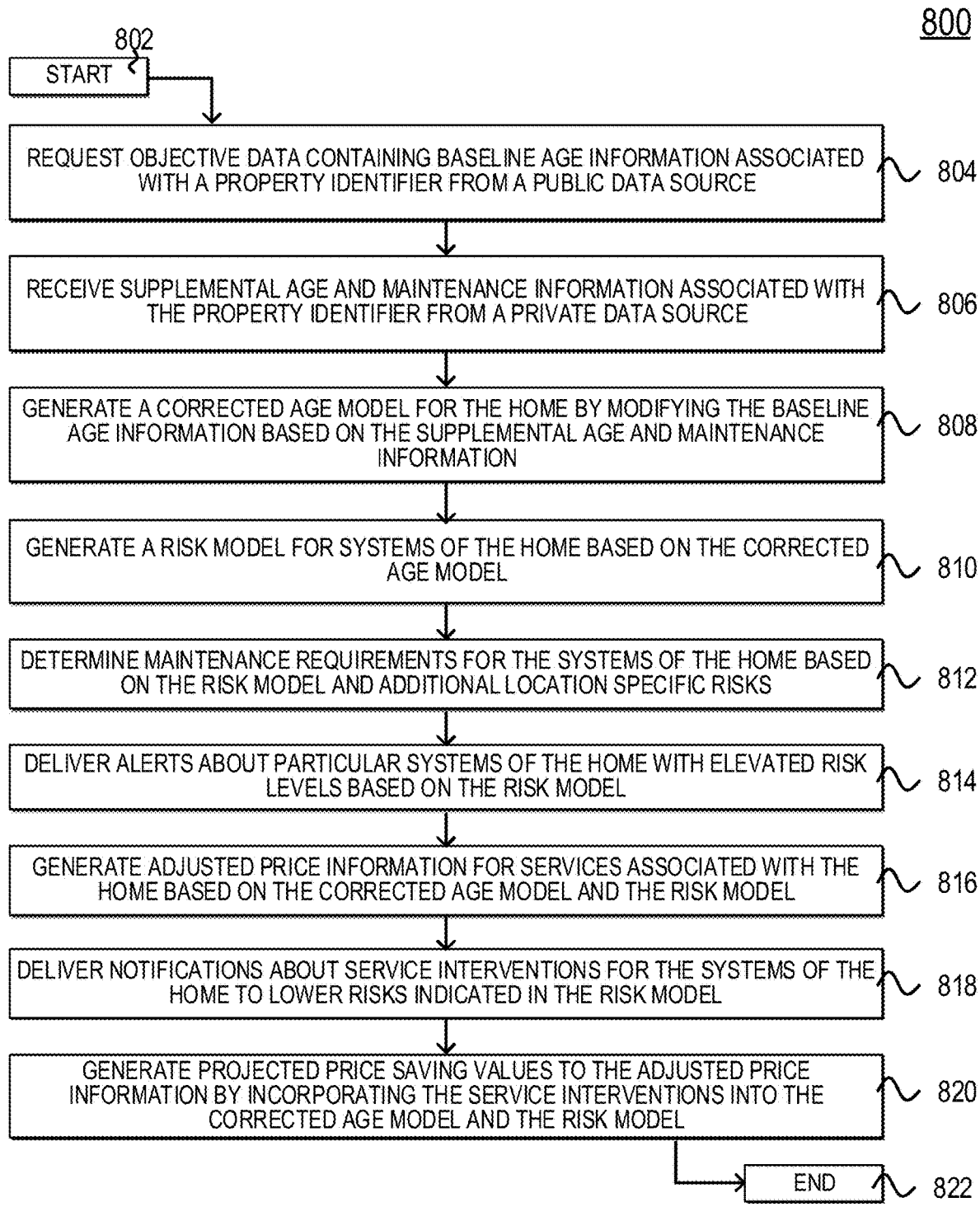
FIG. 8 illustrates an example simplified procedure for smart home modeling.

FIG. 8 illustrates an example simplified procedure 800 for home modeling in accordance with the processes described above. For purposes of discussion, the operations for procedure 800 are described in the context of the smart home modeling system 120 or simply the "system."

Procedure 800 begins at step 802, and continues to step 804, where, as described in greater detail above, the system requests objective data containing baseline age information associated with the home from a public data source. As described above in connection with FIG. 3A, age modeling module 350 requests objective property records from public/government data records of data server 112. Age modeling module 350 uses baseline age determination engine 362 to determine objective information from the property records about baseline ages of the overall home and its systems.

Procedure 800 continues to step 806, where, as described in greater detail above, the system receives supplemental age and maintenance information associated with the home from a private data source. As described above in connection with FIG. 3A, age modeling module 350 receives data from private data sources 301. Supplemental age and maintenance information is determined when age modeling module considers service and upgrade records from records submission interface 304 and smart device sensor data from smart home sensors in smart device 110. Consideration of the smart device sensor data is described in greater detail above in connection with age modeling module engines 360 and sensor and record data evaluation engine 364.

Procedure 800 continues to step 808, where, as described in greater detail above, the system generates a corrected age model for the home by modifying the baseline age information based on the supplemental age and maintenance information. As described above in connection with FIG. 3A, age modeling module engines 360 generate age model 368 using home and system age adjustment engine 366. Engine 366 increases objective age values for a system in age model 368, when sensor data indicate below average performance of the system or when service/upgrade records indicate less-than-expected or less-than-recommended levels of maintenance to the system. Engine 366 decreases objective age values for a system in age model 368, when sensor data indicate above average performance of the system or when service/upgrade records indicate greater-than-expected or greater-than-recommended levels of maintenance to the system. Engine 366 maintains objective age values for a system in age model 368, when sensor data indicate average performance of the system or when service/upgrade records indicate expected or recommended levels of maintenance to the system.

Procedure 800 continues to step 810, where, as described in greater detail above, the system generates a risk model 372 for systems of the home based on the corrected age model 368. As described above in connection with FIG. 3A, risk analysis module 370 requests risk data from risk evaluation resources 308 and generates a system risk model 372 using the effective ages of systems from the age model 368.

Procedure 800 continues to step 812, where, as described in greater detail above, the system determines maintenance needs for the systems of the home based on the risk model and additional location specific risks. As described above in connection with FIG. 3A, maintenance notification module 380 requests location-specific risk data using location-specific risk query generator engine 382 in risk analysis module engines 381. Maintenance schedule reporting engine 384 then determines maintenance needs for the systems after accounting for additional location-specific risks, and conveys these needs and additional alerts in the form of the report of maintenance and risk alerts 385, provided to dashboard module 390.

Procedure 800 continues to step 814, where, as described in greater detail above, the system delivers alerts about particular systems of the home with elevated risk levels based on the risk model. As described above in connection with FIG. 3A, dashboard module 390 generates and updates a virtual dashboard (e.g., dashboard 700 of FIG. 7, or dashboard 399 of FIG. 3B). Model alert generation engine 396 generates alerts regarding risk levels to systems when the system risk model indicates those systems have risk levels exceeding a pre-determined threshold of risk.

Procedure 800 continues to step 816, where, as described in greater detail above, the system generates adjusted price information for services associated with the home based on the corrected age model and the risk model. As described above in connection with FIG. 3A, age- and risk-based price adjustment engine 394 adjusts baseline prices retrieved by baseline pricing engine 392 and generates adjusted prices that account for the corrected age model 368 and the risk model 372 for the home. Generally, when one or more systems of the home have elevated risk levels in the system risk model 372, or have elevated age values in the age model 368, age- and risk-based price adjustment engine 394 generates adjusted price information for services that are higher than the baseline prices retrieved by baseline pricing engine 392. Conversely, when one or more systems of the home have lowered risk levels in the system risk model 372, or have lowered age values in the age model 368, age- and risk-based price adjustment engine 394 generates adjusted price information for services that are lower than the baseline prices retrieved by baseline pricing engine 392.

Procedure 800 continues to step 818, where, as described in greater detail above, the system delivers notifications about service interventions for the systems of the home to lower risks indicated in the risk model. As described above in connection with FIG. 3B, model intervention notifications engine 397 displays notifications on dashboard 399 indicating interventions that can be used to improve the health of systems of the home. Interventions can be provided for systems with an effective age in age model 368 exceeding a threshold age, or for systems with a risk level that exceeds a pre-determined threshold of risk in risk model 372.

Procedure 800 continues to step 820, where, as described in greater detail above, the system generates projected price saving values to the adjusted price information by incorporating the service interventions into the corrected age model and the risk model. As described above in connection with FIG. 7, dashboard 700 can include projected savings for home services by updating the home modeling system 120 and determining the additional price adjustments that would be applied to the adjusted price information generated at step 816, if certain interventions were performed.

The system continues to monitor the data from private data sources 301, risk evaluation resources 308, and location-specific risk query generator engine 382, in real-time, to dynamically update the pricing information, alerts, and notifications provided on dashboard 399. In this fashion, the system continuously updates the home model by updating the age model 368 and downstream system risk models.

Procedure 800 subsequently ends at step 822, but may loop back to step 806 where the system can update the smart home model based on new inputs. It should be noted that certain steps within procedure 800 may be optional, and further, the steps shown in FIG. 8 are merely examples for illustration—certain other steps may be included or excluded as desired. Further, while a particular order of the steps is shown, this ordering is merely illustrative and any suitable arrangement of the steps may be utilized without departing from the scope of the embodiments herein.

The techniques described herein, therefore, describe comprehensive smart home modeling processes that evaluate baseline objective data from public data sources and supplemental data from private data sources, including homeowner records information and smart device sensor data.

The modeling system communicates with data sources that provide data relating to objective information about a building or home, such as records regarding the objective (or, baseline) age and condition of the overall home, including its system components. The system also receives data from data sources that provide information including dynamic data or sensor measurements, such as readings from environmental sensors that operate within the house, including sensors housed within network-connected smart devices. The system determines baseline age information, based on information received from a public data source (e.g., a public/government data server that stores building records associated with property identifiers).

Baseline age information provides a baseline accounting value based on property records for the age of the overall house as well as the respective ages of individual systems of the house. To account for (or otherwise detect) wear or weathering to systems of a building, the current state of the building or home is evaluated based on sensor measurements. Sensor measurements from smart devices operating at a building are presented as a time-series of multiple sensor readouts, or a dynamic readout of sensor readouts in real-time. The smart home modeling system analyses the sensor readouts over a period of time to generate supplemental age and maintenance information indicative of the current state of the house. The smart home modeling system then periodically modifies the baseline age information using the sensor measurements that provide supplemental age and maintenance information.

Measured data, such as the environmental sensor readings from smart devices in a home/building, are aggregated for analysis and determination of the effectiveness of the house systems. Based on whether sensor readings indicate above average, average, or below average performance of the efficiency of a system, the baseline age data for the system is modified to produce a modified age data structure, sometimes referred to as an age model or a comprehensive age model. Additionally, the baseline age data for a system can be modified by user reports of maintenance or upgrade records to any particular system of the building/home.

The modified age data for the overall home/building and each of its systems is compiled to create an age model of the home/building. The age model contains modified or effective ages for the overall house and its systems, specifically reflecting the degree of aging or improvement that is indicated by the sensor readings and user maintenance/upgrade reports provided to the smart home modeling system. An age modeling module determines the particular values for the modified age data structure. The age modeling module then conveys the effective ages for the overall house and its systems to a risk analysis module.

Additionally, supplemental risk data is considered. The techniques evaluate such supplemental data to determine age and risk adjustments associated with systems of a home. The risk analysis module assembles risk information from sources that provide risk analyses and probabilities for buildings corresponding to the modified age data structure contained in the age model. A baseline risk data structure contains probabilities of failure for an overall house and its systems having effective ages corresponding to the values in the modified age data structure or age model. The baseline risk data structure is then modified to produce an overall risk data structure (sometimes referred to as the risk model, or the overall risk model) that further accounts for supplemental risk data collected from public or private data sources. The overall risk model is then conveyed to a dashboard module.

The dashboard module generates notifications to a user regarding the overall risk to various systems of the house, as well as the house itself. Based on the modified age data structure (age model) and the overall risk data structure (risk model) associated with the building, the dashboard module may generate a dashboard for tracking the effects of dynamic data from smart home device sensors and user maintenance/upgrade reports on pricing of certain home services. The dashboard module provides alerts regarding potential maintenance or upgrade services that can mitigate risk of failure for systems of the house. Additionally, the dashboard module provides notifications about interventions that a homeowner can take, by performing certain maintenance or upgrades to systems of the house, to obtain pricing improvements on services or under-writing. These and other features will be discussed herein with respect to various exemplary embodiments of the disclosed stress monitoring and intervention system.

The techniques quantify the supplemental data to determine alerts about particular systems of the home with elevated risk levels, adjusted price information for services associated with the home, and service interventions for the systems of the home to lower risks indicated in the risk model, to ultimately prolong the usable lifespan of the home and provide actionable intervention information to a homeowner that can lower costs associated with owning and insuring the home.

While there have been shown and described illustrative embodiments of a smart home monitoring system, it is to be understood that various other adaptations and modifications may be made within the spirit and scope of the embodiments herein. For example, the embodiments have been shown and described herein with relation to a specific system that organizes certain functions into modules or engines. However, the embodiments in their broader sense are not as limited, and may, in fact, be used with any number of applications, devices, and systems as part of a distributed computing network.

The foregoing description has been directed to specific embodiments. It will be apparent, however, that other variations and modifications may be made to the described embodiments, with the attainment of some or all of their advantages. For instance, it is expressly contemplated that the components and/or elements described herein can be implemented as software being stored on a tangible (non-transitory) computer-readable medium, devices, and memories (e.g., disks/CDs/RAM/EEPROM/etc.) having program instructions executing on a computer, hardware, firmware, or a combination thereof. Further, methods describing the various functions and techniques described herein can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on. In addition, devices implementing methods according to these disclosures can comprise hardware, firmware and/or software, and can take any of a variety of form factors. Typical examples of such form factors include laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example. Instructions, media for conveying such instructions, computing resources for executing them, and other structures for supporting such computing resources are means for providing the functions described in these disclosures. Accordingly, this description is to be taken only by way of example and not to otherwise limit the scope of the embodiments herein. Therefore, it is the object of the appended claims to cover all such variations and modifications as come within the true spirit and scope of the embodiments herein.

The invention claimed is:

1. A system for modeling a building, the system comprising:
one or more network interfaces configured to communicate with a plurality of devices over communication network;
a processor coupled to the one or more network interfaces and adapted to execute one or more processes; and
memory configured to store a process executable by the processor, the process, when executed, is operable to:
request data containing baseline age information associated with a building identifier for a building from a first data source, wherein the first data source is publicly accessible;
receive, from a second data source having a records submission interface that transmits service and upgrade records associated with the building identifier, information relating to a current state of the building, wherein the information comprises sensor data and service and upgrade records associated with the building identifier, and wherein the second data source periodically reports the information to the system;
analyze the sensor data over a period of time;
modify the baseline age information based on the information relating to the current state of the building to yield modified age information; and
generate a corrected age model for the building using the modified age information.

2. The system of claim 1, wherein the process is further operable to:
generate a risk model for systems of the building based on the corrected age model; and
deliver a notification corresponding to an intervention for at least one of the systems of the building to lower risks indicated in the risk model.

3. The system of claim 2, wherein the process is further operable to:
generate price information for services associated with the building based on the corrected age model and the risk model.

4. The system of claim 3, wherein the process is further operable to:
generate price savings for the price information that incorporates the intervention into the corrected age model and the risk model.

5. The system of claim 2, wherein the process is further operable to:
determine maintenance for the systems of the building based on the risk model and additional location specific risks.

6. The system of claim 2, wherein the process is further operable to:
deliver alerts about particular systems of the building with elevated risk levels based on the risk model.

7. The system of claim 1, wherein the first data source is a public data server comprising a database that stores property records associated with the building identifier, and wherein the second data source comprises smart devices associated with the building identifier.

8. A method, comprising:
requesting data containing baseline age information associated with a building identifier for a building from a first data source, wherein the first data source is publicly accessible;
receiving, from a second data source having a records submission interface that transmits service and upgrade records associated with the building identifier, information relating to a current state of the building, wherein the information comprises sensor data and service and upgrade records associated with the building identifier, and wherein the second data source periodically updates the information;
analyzing the sensor data over a period of time;
modifying the baseline age information based on the information relating to the current state of the building to yield modified age information; and
generate a corrected age model for the building using the modified age information.

9. The method of claim 8, further comprising:
generating a risk model for systems of the building based on the corrected age model; and
delivering a notification about an intervention for at least one of the systems of the building to lower risks indicated in the risk model.

10. The method of claim 9, further comprising:
generating price information for services associated with the building based on the corrected age model and the risk model.

11. The method of claim 10, further comprising:
generating price savings for the price information that incorporates the intervention into the corrected age model and the risk model.

12. The method of claim 9, further comprising:
determining maintenance for the systems of the building based on the risk model and additional location specific risks.

13. The method of claim 11, further comprising:
delivering alerts about particular systems of the building with elevated risk levels based on the risk model.

14. The method of claim 8, wherein the first data source is a public data server comprising a database that stores property records associated with the building identifier, and wherein the second data source comprises smart devices associated with the building identifier.

15. A tangible, non-transitory, computer-readable medium having instructions encoded thereon, the instructions, when executed by a processor, are operable to:
request data containing baseline age information associated with a building identifier for a building from a first data source, wherein the first data source is publicly accessible;
receive, from a second data source having a records submission interface that transmits service and upgrade records associated with the building identifier, information relating to a current state of the building, wherein the information comprises sensor data and service and upgrade records associated with the building identifier, and wherein the second data source periodically updates the information;
analyze the sensor data over a period of time;
modify the baseline age information based on the information relating to the current state of the building to yield modified age information; and
generate a corrected age model for the building using the modified age information.

16. The tangible, non-transitory, computer-readable medium of claim 15, comprising additional instructions encoded thereon, the additional instructions, when executed by the processor, being operable to:
generate a risk model for systems of the building based on the corrected age model;
deliver a notification corresponding to an intervention for at least one of the systems of the building to lower risks indicated in the risk model; and
determine maintenance for the systems of the building based on the risk model and additional location specific risks.

17. The tangible, non-transitory, computer-readable medium of claim 15, wherein the first data source is a public data server comprising a database that stores property records associated with the building identifier, and wherein the second data source comprises smart devices associated with the building identifier.

* * * * *